US011956980B2

(12) United States Patent
Kim et al.

(10) Patent No.: US 11,956,980 B2
(45) Date of Patent: Apr. 9, 2024

(54) ORGANIC LIGHT EMITTING DEVICE AND DISPLAY DEVICE USING THE SAME

(71) Applicant: LG Display Co., Ltd., Seoul (KR)

(72) Inventors: Gyeong-Woo Kim, Seoul (KR); Hong-Seok Choi, Seoul (KR); Seung-Ryong Joung, Seoul (KR); Jun-Ho Lee, Seoul (KR); Yoon-Deok Han, Yongin-si (KR); Hee-Su Byeon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 190 days.

(21) Appl. No.: 17/133,874

(22) Filed: Dec. 24, 2020

(65) Prior Publication Data

US 2021/0202876 A1 Jul. 1, 2021

(30) Foreign Application Priority Data

Dec. 26, 2019 (KR) ........................ 10-2019-0175566

(51) Int. Cl.

*H10K 50/12* (2023.01)
*H10K 50/11* (2023.01)
*H10K 59/121* (2023.01)
*H10K 59/38* (2023.01)
*H10K 101/10* (2023.01)

(52) U.S. Cl.

CPC ........... *H10K 50/121* (2023.02); *H10K 50/11* (2023.02); *H10K 59/1213* (2023.02); *H10K 59/38* (2023.02); *H10K 2101/10* (2023.02)

(58) Field of Classification Search

CPC ............... H01L 51/5028; H01L 27/322; H01L 27/3262; H01L 51/5016; H01L 51/5012; H01L 51/5004; H01L 51/5024; H01L 51/0084–0092; H01L 51/5048–5084; H01L 51/5092; H01L 51/5096; H01L 2251/552; G02B 5/20

See application file for complete search history.

(56) References Cited

U.S. PATENT DOCUMENTS

2010/0270539 A1* 10/2010 Nishimura ................ C09B 3/78 257/E51.026
2014/0070194 A1* 3/2014 Lai ......................... H10K 50/13 257/40
2015/0104636 A1* 4/2015 Takemura ............ H10K 50/844 427/535
2016/0181563 A1* 6/2016 Cho ....................... H10K 50/13 257/40
2017/0141323 A1* 5/2017 Miyazaki ............... H10K 50/11
2018/0013087 A1* 1/2018 Wang ................... H10K 85/657

(Continued)

FOREIGN PATENT DOCUMENTS

KR 10-2017-0055535 A 5/2017
KR 10-2019-0029535 A 3/2019
KR 10-2021-0039516 A 4/2021

*Primary Examiner* — Mohammad A Rahman
(74) *Attorney, Agent, or Firm* — Birch, Stewart, Kolasch & Birch, LLP

(57) ABSTRACT

Discussed is an organic light emitting device in which a light emitting layer includes a host and different kinds of dopants, the fluorescent dopant is formed of a material having energy level properties facilitating thermally activated delayed fluorescence (TADF), and thus energy is concentratedly transferred to the fluorescent dopant so as to increase luminous efficacy of a single color.

22 Claims, 18 Drawing Sheets

120 Cathode
116 EIL
115 ETL
114 HBL
CML2
130 Host: PD: FD
113 EBL
112 HTL
111 HIL
CML1
110 Anode

(56) References Cited

U.S. PATENT DOCUMENTS

| | | | | |
|---|---|---|---|---|
| 2019/0013478 | A1* | 1/2019 | Iijima | H10K 85/636 |
| 2019/0081264 | A1* | 3/2019 | Yun | H10K 50/19 |
| 2019/0103562 | A1* | 4/2019 | Tada | H10K 50/00 |
| 2019/0115554 | A1* | 4/2019 | Xie | H10K 71/00 |
| 2019/0363274 | A1* | 11/2019 | Yoo | H01L 51/5056 |
| 2019/0372022 | A1* | 12/2019 | Yoon | H01L 51/0073 |
| 2020/0243799 | A1* | 7/2020 | Qu | H10K 50/11 |
| 2020/0395547 | A1* | 12/2020 | Kim | H10K 85/654 |

* cited by examiner

FIG. 5A

Device A

| Al (100 nm) |
|---|
| EIL (1 nm) |
| ETL (30 nm) |
| HBL (5 nm) |
| 10% PD<br>Host1: Host2 [1:2]<br>(30 nm) |
| EBL (5 nm) |
| HTL (25 nm) |
| HIL (10 nm) |
| ITO (75 nm) |

FIG. 5B

Device B

| Al (100 nm) |
|---|
| EIL (1 nm) |
| ETL (30 nm) |
| HBL (5 nm) |
| 3% FD<br>Host1: Host2 [1:2]<br>(30 nm) |
| EBL (5 nm) |
| HTL (25 nm) |
| HIL (10 nm) |
| ITO (75 nm) |

FIG. 5C

Device C

| Al (100 nm) |
|---|
| EIL (1 nm) |
| ETL (30 nm) |
| HBL (5 nm) |
| 3% FD : 10% PD Host1: Host2 [1:2] (30 nm) |
| EBL (5 nm) |
| HTL (25 nm) |
| HIL (10 nm) |
| ITO (75 nm) |

ORGANIC LIGHT EMITTING DEVICE AND DISPLAY DEVICE USING THE SAME

CROSS-REFERENCE TO RELATED APPLICATION

This application claims the priority benefit of Korean Patent Application No. 10-2019-0175566, filed in the Republic of Korea on Dec. 26, 2019, which is hereby incorporated by reference as if fully set forth herein into the present application.

BACKGROUND OF THE INVENTION

Field of the Invention

The present invention relates to a light emitting device, and more particularly, to an organic light emitting device, which includes different kinds of dopants in one light emitting layer, and secures the luminescence property of a single color and achieves lifespan improvement by transferring energy to one of the different kinds of dopants, and a display device using the same.

Discussion of the Related Art

As society has recently entered the information age, the field of displays for visually displaying electrical information signals has rapidly developed and, in order to satisfy such development, various flat display devices having excellent performance, such as slimness, light weight and low power consumption, have been developed and have rapidly replaced conventional cathode ray tubes (CRTs).

As examples of such flat display devices, there are a liquid crystal display (LCD) device, a plasma display panel (PDP) device, a field emission display (FED) device, an organic light emitting diode (OLED) display device, a quantum dot display device, etc.

Thereamong, an organic light emitting diode (OLED) display device, which does not require a separate light source and achieves compactness and clear color display, is considered as a competitive application.

In the organic light emitting diode (OLED) display device, a plurality of subpixels is provided, and an organic light emitting diode including a light emitting layer between electrodes opposite each other is arranged in each subpixel. Further, the organic light emitting diode in the subpixel emits light due to formation of an electric field between the electrodes, thus exhibiting a display function.

Such a light emitting layer includes a host as a main ingredient, and further includes a dopant which can determine a color of emitted light. Further, dopants are divided into fluorescent dopants and phosphorescent dopants according to luminescence methods. Properties of the fluorescent dopants and phosphorescent dopants are different according to colors of emitted light, and particularly, in case of a blue light emitting layer, none of the well-known fluorescent dopants and phosphorescent dopants is capable of exhibiting excellent properties in terms of lifespan and efficiency. Therefore, in order to implement an organic light emitting display device which can achieve full color display in the overall visible range, development of materials for color light emitting layers is carried out, but a blue light emitting layer has difficulty in composing a material therefor which satisfies both lifespan and color efficiency as compared to other colored light emitting layers. Therefore, among different colored light emitting layers, the blue light emitting layer has low efficiency and reduced lifespan and these changes become conspicuous over time, and development of a material for the blue light emitting layer which can satisfy both efficiency and lifespan is still needed.

SUMMARY OF THE INVENTION

Accordingly, the present invention is directed to an organic light emitting device and a display device using the same that substantially obviate one or more problems associated with limitations and disadvantages of the related art.

An object of the present invention is to provide an organic light emitting device, which includes different kinds of dopants in one light emitting layer, and secures the luminescence property of a single color and achieves lifespan improvement by transferring energy to one of the different kinds of dopants, and a display device using the same.

Another object of the present invention is to provide an organic light emitting device in which different kinds of dopants, i.e., a phosphorescent dopant and a fluorescent dopant, are included in a light emitting layer in addition to a host, the fluorescent dopant is formed of a material having energy level properties facilitating thermally activated delayed fluorescence (TADF), and thus energy is concentratedly transferred to the fluorescent dopant so as to increase luminous efficacy of a single color.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, an organic light emitting device includes a light emitting layer provided between a first electrode and a second electrode arranged opposite each other, wherein the light emitting layer includes at least one host, a phosphorescent dopant configured to have a first triplet energy level, and a fluorescent dopant configured to have a second triplet energy level lower than the first triplet energy level and to generate thermally activated delayed fluorescence (TADF).

In another aspect of the present invention, a display device includes a substrate including a plurality of subpixels, a thin film transistor provided in each of the subpixels, and an organic light emitting device provided in each of the subpixels so as to be connected to the thin film transistor, wherein the organic light emitting device includes a first electrode and a second electrode arranged opposite each other, and a plurality of stacks provided between the first and second electrodes so as to be distinguished from each other by charge generation layers, wherein a light emitting layer of at least one of the stacks includes at least one host, a phosphorescent dopant configured to have a first triplet energy level, and a fluorescent dopant configured to have a second triplet energy level lower than the first triplet energy level and to generate thermally activated delayed fluorescence (TADF).

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 5A to 5C are cross-sectional views illustrating organic light emitting devices according to first to third test examples;

DETAILED DESCRIPTION OF THE EMBODIMENTS

Figure 1:
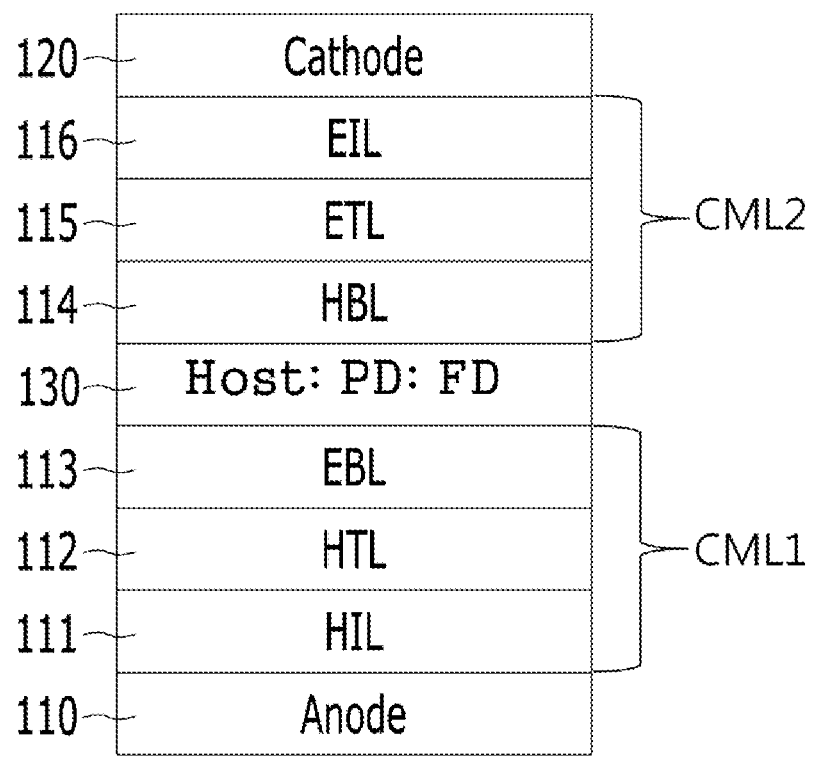
FIG. 1 is a cross-sectional view illustrating an organic light emitting device according to a first embodiment of the present invention.

Reference will now be made in detail to the exemplary embodiments of the present invention, examples of which are illustrated in the accompanying drawings. In the following description of the embodiments and the drawings, the same or similar elements are denoted by the same reference numerals throughout the specification. In the following description of the embodiments of the present invention, a detailed description of known functions and configurations incorporated herein will be omitted when it can make the subject matter of the present invention rather unclear. Further, the names of elements used in the following description of the embodiments of the present invention are selected in consideration of ease of preparation of the specification, and can thus differ from the names of parts of an actual product.

The shapes, sizes, ratios, angles and numbers of elements given in the drawings to describe the embodiments of the present invention are merely exemplary, and thus, the present invention is not limited to the illustrated details. In the following description of the embodiments, the terms "including", "comprising" and "having" are to be interpreted as indicating the presence of one or more other characteristics, numbers, steps, operations, elements or parts stated in the specification or combinations thereof, and do not exclude the presence of other characteristics, numbers, steps, operations, elements, parts or combinations thereof, or the possibility of adding the same, unless the term "only" is used. It will be understood that a singular expression of an element(s) encompasses a plural expression unless the context clearly indicates otherwise.

In interpretation of elements included in the various embodiments of the present invention, it is to be interpreted that the elements include error ranges unless stated otherwise.

In the following description of the embodiments of the present invention, it will be understood that, when positional relationships are expressed, for example, when an element is said to be "on", "above", "under" or "beside" another element, the two elements can directly contact each other, or one or more other elements can be interposed between the two elements, unless the term "just" or "directly" is used.

In the following description of the embodiments of the present invention, it will be understood that, when temporal relationships are expressed, for example, when terms expressing a sequence of events, such as "after", "subsequent to", "next" and "before" are used, the terms encompass both a continuous relationship between the events and a discontinuous relationship between the events, unless the term "just" or "directly" is used.

In the following description of the embodiments of the present invention, it will be understood that, when the terms "first", "second", etc. are used to describe various elements, these terms are used merely to distinguish the same or similar elements and may not define any order. Therefore, a first element described hereinafter could be termed a second element without departing from the technical scope of the invention.

Respective features of the various embodiments of the present invention can be partially or wholly coupled to or combined with each other and be interlocked or driven in various technical manners, and the respective embodiments can be implemented independently of each other or be implemented together through connection therebetween.

In the following description of the embodiments, the terms "Lowest Unoccupied Molecular Orbital (LUMO) energy level" and "Highest Occupied Molecular Orbital (HOMO) energy level" of a layer preferably mean a LUMO energy level and a HOMO energy level of a material occupying the majority of the weight of the corresponding layer, for example, a host material, unless they refer to the LUMO energy level and the HOMO energy level of a dopant material with which the corresponding layer is doped.

In the following description of the embodiments, it will be understood that the term "HOMO energy level" preferably means an energy level measured through cyclic voltammetry (CV) in which an energy level is determined from a potential value relative to that of a reference electrode having a known electrode potential value. For example, the HOMO energy level of any material can be measured using ferrocene having a known oxidation potential value and reduction potential value, as a reference electrode.

In the following description of the embodiments, the term “doped” preferably means that less than 50 wt % of the content of a material having properties different from a material occupying the majority of the weight of a corresponding layer (materials having different properties being, for example, N-type and P-type materials, or an organic material and an inorganic material) is added to the material occupying the majority of the weight of the corresponding layer. In other words, a “doped” layer preferably means a layer in which a host material and a dopant material can be distinguished from each other based on the ratio of the weight percentages thereof. In addition, the term “undoped” preferably means all cases other than the case corresponding to the term “doped”. For example, if a layer is formed of a single material or is formed of a mixture of materials having the same or similar properties, the layer can be an “undoped” layer. For example, if some of materials forming a layer are P-type (or N-type) and all of the materials forming the layer are not P-type (or N-type), the layer can be regarded as a layer “doped with” the P-type materials. For example, if some of materials forming a layer are small amounts of inorganic materials and the remainder of the materials forming the layer, i.e., main materials, are organic materials, the layer can be regarded as a layer “doped with” with the inorganic materials.

In the following description of the embodiments, an electroluminescence (EL) spectrum is calculated by multiplying (1) a photoluminescence (PL) spectrum, in which the intrinsic properties of a light emitting material, such as a dopant material or a host material included in an organic light emitting layer, are reflected, by (2) an out-coupling emittance spectrum curve which is determined by the structure and optical properties of an organic light emitting element including the thickness of organic layers, such as a hole transport layer and an electron transport layer.

Hereinafter, an organic light emitting device and a display device using the same according to the present invention will be described with reference to the accompanying drawings.

Figure 2:
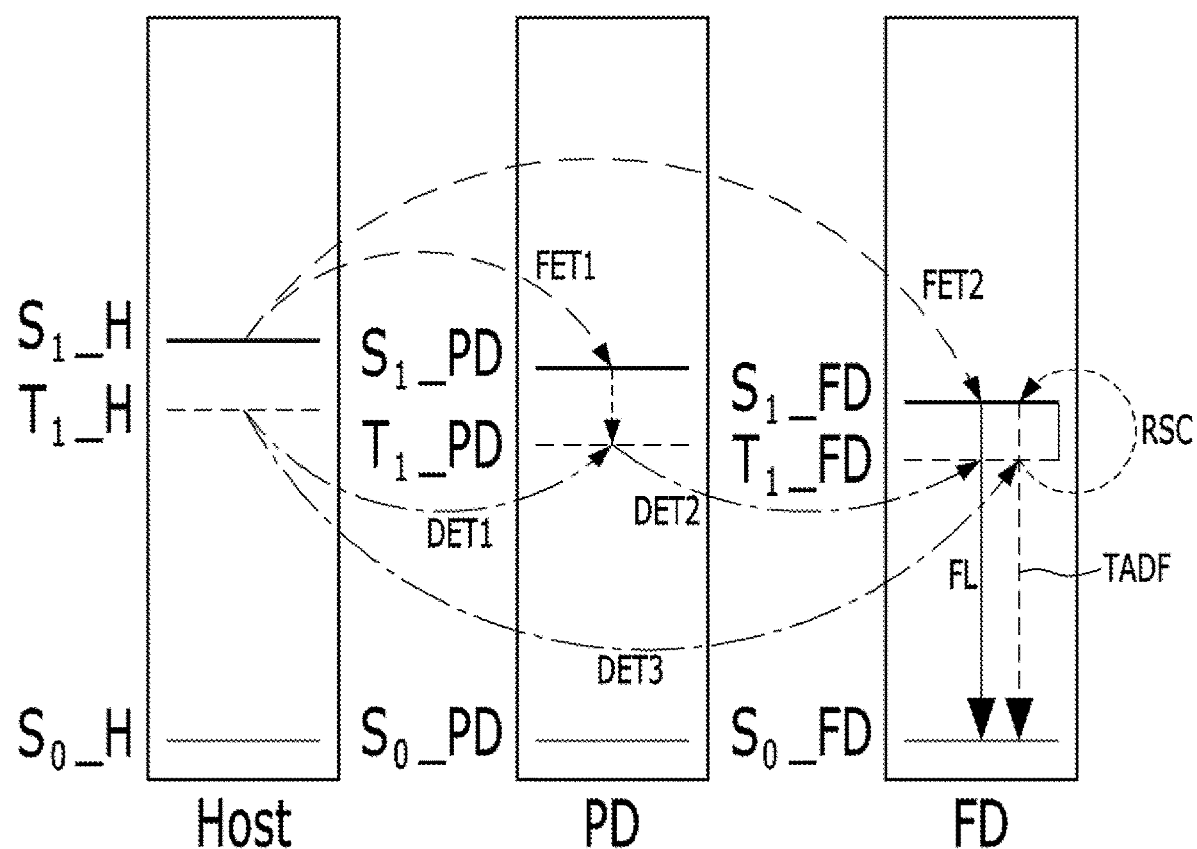
FIG. 2 is a view illustrating energy transfer relationships in a light emitting layer of FIG. 1.
Figure 3:
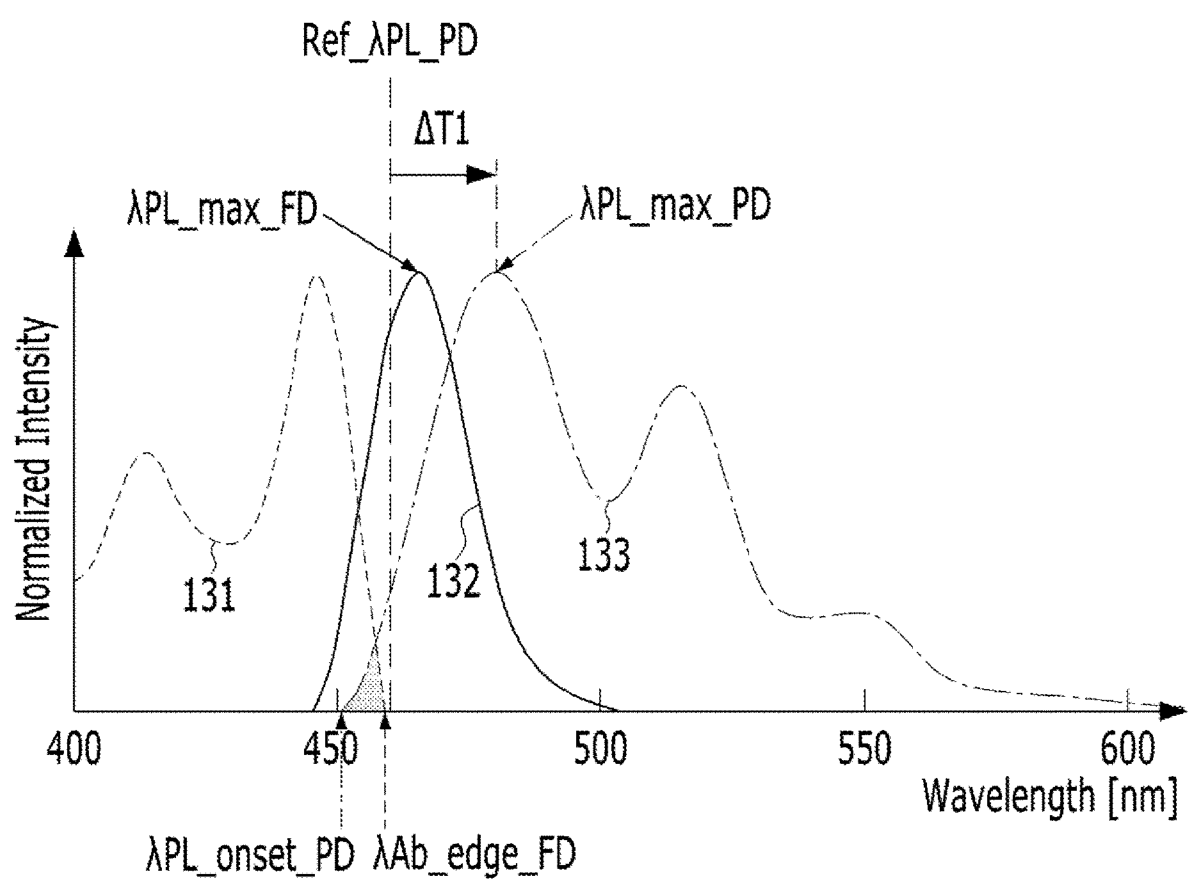
FIG. 3 is a graph showing the photoluminescence (PL) spectrum of a phosphorescent dopant and the PL spectrum and absorption spectrum of a fluorescent dopant in the light emitting layer of FIG. 1.

FIG. 1 is a cross-sectional view illustrating an organic light emitting device according to a first embodiment of the present invention, FIG. 2 is a view illustrating energy transfer relationships in a light emitting layer of FIG. 1, and FIG. 3 is a graph showing the PL spectrum of a phosphorescent dopant and the PL spectrum and absorption spectrum of a fluorescent dopant in the light emitting layer of FIG. 1. All the components of the organic light emitting device according to all embodiments of the present invention are operatively coupled and configured.

Figure 4:
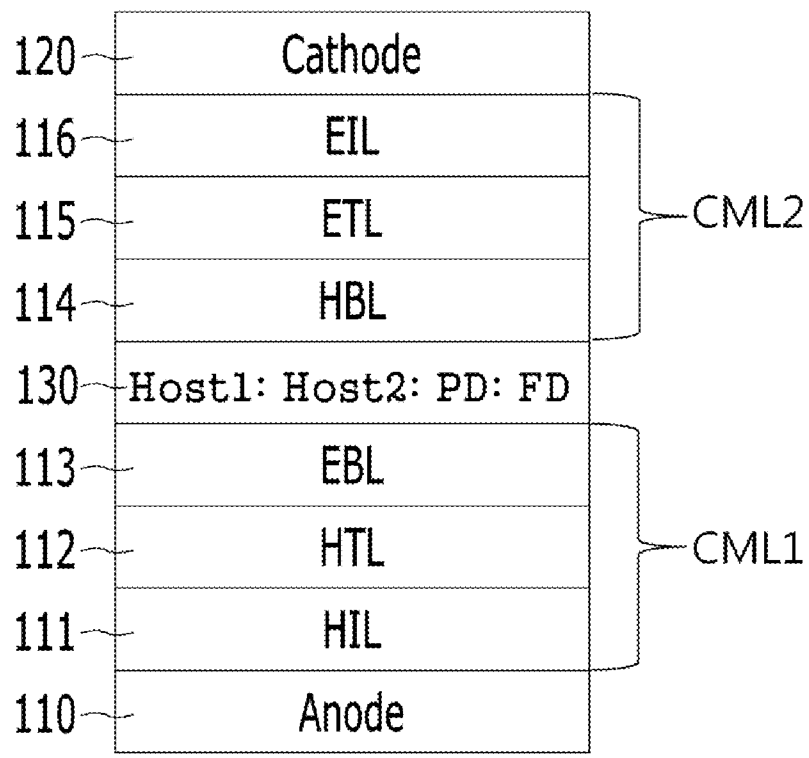
FIG. 4 is a cross-sectional view illustrating an organic light emitting device according to a second embodiment of the present invention.

FIG. 4 is a cross-sectional view illustrating an organic light emitting device according to a second embodiment of the present invention.

As shown in FIG. 1, the organic light emitting device according to the first embodiment of the present invention includes a light emitting layer 130 provided between a first electrode 110 and a second electrode 120 arranged opposite each other, and includes at least one first common layer CML1 relating to hole transport, provided between the first electrode 110 and the light emitting layer 130, and at least one second common layer CML2 relating to electron transport, provided between the light emitting layer 130 and the second electrode 120.

As shown in FIG. 1, each of the at least one first common layer CML1 and the at least one second common layer CML2 can include a plurality of layers. For example, the at least one first common layer CML1 can include a hole injection layer 111, a hole transport layer 112 and an electron blocking layer 113, and the at least one second common layer CML2 can include a hole blocking layer 114, an electron transport layer 115 and an electron injection layer 116. According to other embodiments which will be described below, some layers of the first and second common layers CML1 and CML2 can be omitted as needed.

In the organic light emitting device according to the first embodiment of the present invention, the light emitting layer 130 includes a host, a phosphorescent dopant PD and a fluorescent dopant FD. In the light emitting layer 130, the host and the phosphorescent dopant do not autonomously emit light, and are used to transfer energy to the fluorescent dopant FD. For example, as shown in FIG. 2, the host transfers energy of singlet excitons in the singlet excited state thereof to the singlet excited state of the phosphorescent dopant PD and the singlet excited state of the fluorescent dopant FD through Förster energy transfer (FET) FET1 and FET2, and the host transfers energy of triplet excitons in the triplet excited state thereof to the triplet excited state of the phosphorescent dopant PD and the triplet excited state of the fluorescent dopant FD through Dexter energy transfer (DET) DET1 and DET3.

Further, the phosphorescent dopant PD transitions the energy, transmitted from the host to the singlet excited state of the phosphorescent dopant PD through Förster energy transfer FET1, to the triplet excited state of the phosphorescent dopant PD through intersystem crossing (ISC), and transfers the energy, transmitted from the triplet excited state of the host directly to the triplet excited state of the phosphorescent dopant PD through Dexter energy transfer DET1, and the energy in the triplet excited state of the phosphorescent dopant PD, transferred through intersystem crossing (ISC), to the triplet excited state of the adjacent fluorescent dopant FD through Dexter energy transfer DET2.

Further, in the fluorescent dopant FD, as excitons in the singlet excited state of the fluorescent dopant FD, transferred by Förster energy transfer FET2 from the host, fall to the ground state $S_0$_FD, fluorescence F1 occurs, and as the energy transferred to the triplet excited state of the fluorescent dopant FD by Dexter energy transfer DET2 and DET3 return to the singlet excited state of the fluorescent dopant FD through reversed intersystem crossing (RISC) and then excitons in the singlet excited state of the fluorescent dopant FD fall to the ground state $S_0$_FD, thermally activated delayed fluorescence (TADF) occurs.

For example, in the organic light emitting device according to the first embodiment of the present invention, light is ultimately emitted from the fluorescent dopant FD in the light emitting layer 130, and light emission is realized by fluorescence F1 occurring due to energy transferred directly from the host through Förster energy transfer (FET) and thermally activated delayed fluorescence (TADF) occurring due to transition of the energy, transferred from the host and the phosphorescent dopant PD to the triplet excited state of the fluorescent dopant FD through Dexter energy transfer (DET), again to the singlet excited state of the fluorescent dopant FD through reverse intersystem crossing (RISC).

Here, the fluorescent dopant FD is configured such that a difference between the triplet energy level $T_1$_FD and the singlet energy level $S_1$_FD is 0.4 eV or less, thereby facilitating reverse intersystem crossing (RISC) of the energy, transferred to the triplet excited state through Dexter energy transfer (DET), from the triplet excited state to the singlet excited state of the fluorescent dopant FD.

Further, in the following description of the embodiments of the invention, the energy level of the singlet excited state is commonly called a singlet energy level $S_1$, and the energy level of the triplet excited state is commonly called a triplet energy level $T_1$. The actual value of the singlet energy level $S_1$ is acquired through comparison with the energy level $S_0$ of the ground state of each material, and the values of the singlet energy levels $S_1$_H, $S_1$_PD and $S_1$_FD of the host, the phosphorescent dopant PD and the fluorescent dopant FD are respectively greater than the values of the triplet energy levels $T_1$_H, $T_1$_PD and $T_1$_FD of thereof.

Further, in the organic light emitting device according to the first embodiment of the present invention, in order to facilitate Dexter energy transfer (DET), the triplet energy levels $T_1$_H and $T_1$_PD of materials which transmit energy must be higher than or equal to the triplet energy levels $T_1$_PD and $T_1$_FD of materials which receive energy. For example, when the triplet energy level $T_1$_H of the host is higher than or equal to the triplet energy level $T_L$_PD of the phosphorescent dopant PD, and the triplet energy level $T_1$_FD of the fluorescent dopant FD is lower than the triplet energy level $T_1$_H of the host and the triplet energy level $T_1$_PD of the phosphorescent dopant PD, so that the fluorescent dopant FD can advantageously function as a dopant which receives energy transferred from the host and the phosphorescent dopant PD and emits light.

The phosphorescent dopant PD in the light emitting layer 130 according to the present invention has a main function of transferring energy of excitons thereof in the singlet and triplet excited states thereof and energy received from the host to the fluorescent dopant FD, and light is ultimately emitted from the fluorescent dopant FD due to fluorescence F1 of the fluorescent dopant FD itself and thermally activated delayed fluorescence (TADF) in the fluorescent dopant FD. Therefore, in the light emitting layer 130 of the organic light emitting device according to the present invention, light is emitted from the fluorescent dopant FD of a unicolor (single color), and the fluorescent dopant FD induces thermally activated delayed fluorescence (TADF) together with fluorescence F1, and thus theoretically has internal quantum efficiency of 100%.

Further, as shown in FIG. 3, in the light emitting layer 130 according to the present invention, a spectral overlap between the absorption spectrum λAb_FD 131 of the fluorescent dopant FD and the photoluminescence spectrum λPL_PD 133 of the phosphorescent dopant PD, inducing Förster energy transfer (FET) from the phosphorescent dopant PD to the fluorescent dopant FD, is very small, i.e., about 20 nm or less, but, as shown in FIG. 2, thermally activated delayed fluorescence (TADF) can occur at a high efficiency using the mechanism which transfers energy from the triplet excited state of the phosphorescent dopant PD to the triplet excited state of the fluorescent dopant FD through Dexter energy transfer (DET) and then transitions the energy from the triplet excited state of the fluorescent dopant FD to the singlet excited state of the fluorescent dopant FD through reverse intersystem crossing (RISC). Here, undescribed reference numeral 132 indicates the photoluminescence spectrum λPL FD of the fluorescent dopant FD, and in the light emitting layer 130 according to the present invention, a difference between the emission peak wavelength λPL_max_FD of the fluorescent dopant FD and the emission peak wavelength λPL_max_PD of the phosphorescent dopant PD falls within the range of 40 nm, and thus different kinds of dopants showing similar colors can be used in the light emitting layer 130.

Since Förster energy transfer (FET) from the triplet energy level $T_1$_PD of the phosphorescent dopant PD to the singlet energy level $S_1$_FD of the fluorescent dopant FD is not the main energy transfer mechanism, the organic light emitting device according to the present invention is not deeply involved in the spectral overlap between the absorption spectrum λAb_FD 131 of the fluorescent dopant FD and the photoluminescence spectrum λPL_PD 133 of the phosphorescent dopant PD, and thus, the triplet energy level $T_1$_PD of the phosphorescent dopant PD does not need to be higher than the singlet energy level $S_1$_FD of the fluorescent dopant FD.

For example, since the spectral overlap between the absorption spectrum λAb_FD 131 of the fluorescent dopant FD and the photoluminescence spectrum λPL_PD 133 of the phosphorescent dopant PD is very small, the triplet energy level $T_1$_PD of the phosphorescent dopant PD does not need to be higher than the singlet energy level $S_1$_FD of the fluorescent dopant FD, and thus, the triplet energy level $T_L$_PD of the phosphorescent dopant PD can be relatively lowered. This preferably means that the phosphorescent dopant PD included in the light emitting layer 130 can be selected from materials having triplet energy levels similar to the triplet energy level $T_1$_FD of the fluorescent dopant FD.

Usage of a phosphorescent dopant PD having a low triplet energy level $T_L$_PD has the following effects.

When a phosphorescent dopant is used as a single dopant in a light emitting layer, internal quantum efficiency is theoretically high but the extinction time of excitons is long and thus the excitons in the triplet excited state remain for a long time in the light emitting layer, triplet-triplet annihilation (TTA), in which triplet excitons meet each other and are thus annihilated, or triplet-polaron annihilation (TPA), in which triplet excitons not used in excitation interact with polarons in a polar molecule state and thus they are annihilated, occur and thus the light emitting device has a short lifespan. Particularly, among phosphorescent dopants, a blue phosphorescent dopant tends to have a hot excited state energy level. The hot excited state energy level is about 2 times the triplet energy level. Because the hot excited state energy level can be decreased by 2a when the triplet energy level is decreased by a, even when a blue phosphorescent dopant is used as the phosphorescent dopant PD applied to the mechanism of the light emitting layer 130 according to the present invention, a difference in the triplet energy levels between the blue phosphorescent dopant and a blue fluorescent dopant is small and thus stability of the structure of the phosphorescent dopant PD provided in the light emitting layer 130 can be ensured and improvement in the lifespan thereof can be expected. When the hot excited state energy level is excessively high and is thus higher than the ligand dissociation energy of the corresponding dopant, ligand binding of the dopant is dissociated and the dopant loses the intrinsic luminescence property thereof, and thus, luminous efficacy is lowered or the deteriorated dopant acts as a charge lab and thus reduces recombination efficiency between holes and electrons or acts as an exciton quencher and thus extinguishes excitons therearound without luminescence. In this case, designated molecular bond structures of the phosphorescent dopant are broken, and these broken molecular bond structures of the phosphorescent dopant lower the efficiency of the light emitting device and impede the exciting functions of other adjacent dopant materials, thereby deteriorating the efficiency and lifespan of the light emitting device.

In the present invention, the phosphorescent dopant PD included in the light emitting layer 130 does not require a high triplet energy level inducing the hot excited state energy level, and thereby, stability of the material for the phosphorescent dopant PD is ensured and thus an organic light emitting device having high luminous efficacy for a long time can be implemented. For example, when the triplet energy level T1_PD of the phosphorescent dopant PD is lowered, the triplet energy level of the host and the triplet energy level of the hole blocking layer or the electron blocking layer adjacent to the light emitting layer 130 are lowered, and thus stability of materials for the host and the common layer (the hole blocking layer or the electron blocking layer) can also be improved. In general, in order to acquire a high triplet energy level, a material designed such that the conjugation length of molecules is minimized is used, and molecular structures having the long conjugation length tend to become unstable in an excited state or an ionized state. Therefore, as the triplet energy level required by the phosphorescent dopant PD, the host, or the hole or electron blocking layer adjacent to the light emitting layer is lowered, a stable material can be developed and development of a device can be facilitated.

For example, in the light emitting layer 130 according to the present invention, because Dexter energy transfer is performed at least when the triplet energy level $T_1$_PD of the phosphorescent dopant PD is higher than or equal to the triplet energy level $T_1$_FD of the fluorescent dopant FD, energy transfer from the phosphorescent dopant PD to the fluorescent dopant FD can be performed even when the triplet energy level $T_1$_PD of the phosphorescent dopant PD is lower than or equal to the singlet energy level $S_1$_FD of the fluorescent dopant FD, and thus the phosphorescent dopant PD can have a low triplet energy level $T_1$_PD and thereby stability of the material for the phosphorescent dopant PD is increased. The organic light emitting device according to the present invention, in which the phosphorescent dopant PD and the fluorescent dopant FD are mixed with the host in the light emitting layer 130, applies the Dexter energy transfer mechanism mostly to transfer of energy from the phosphorescent dopant PD to the fluorescent dopant FD, and the triplet energy level $T_1$_PD of the phosphorescent dopant PD does not need to be higher than the singlet energy level $S_1$_FD of the fluorescent dopant FD, and thus, the triplet energy level $T_1$_PD of the phosphorescent dopant PD can be kept relatively low. Thereby, luminous efficacy of the fluorescent dopant FD can be improved due to fluorescence of the fluorescent dopant FD itself and thermally activated delayed fluorescence (TADF) in the fluorescent dopant FD, and the lifespan and stability of the organic light emitting device can be improved.

In the light emitting layer 130 according to the present invention, the full width at half maximum (FWHM) of the photoluminescence (PL) spectrum of the fluorescent dopant FD is 40 nm or less, and light emission is concentrated upon a narrow wavelength range. In the present invention, light emission occurs in the fluorescent dopant FD and thus the photoluminescence spectrum of the fluorescent dopant FD is significant, and particularly, the FWHM of the fluorescent dopant FD is narrow and thus implementation of a cavity structure in the organic light emitting device or reduction in optical loss through a color filter layer can be achieved and luminous efficacy of the light emitting layer 130 can be maximized.

Further, as shown in FIG. 3, even when the spectral overlap between the photoluminescence (PL) spectrum λPL_PD 133 of the phosphorescent dopant PD and the absorption spectrum λAb_FD 131 of the fluorescent dopant FD in the light emitting layer 130 according to the preset invention is 20 nm or less, thermally activated delayed fluorescence (TADF) can occur in the fluorescent dopant FD due to Dexter energy transfer (DEF) from the phosphorescent dopant PD to the fluorescent dopant FD, as shown in FIG. 2. Therefore, the phosphorescent dopant PD according to the present invention can reduce the triplet energy level by a difference ΔT1 between the emission peak wavelength λPL_max_PD of the phosphorescent dopant PD according to the present invention and the emission peak wavelength Ref_λPL_max_PD of the photoluminescence (PL) spectrum of a phosphorescent dopant PD having a structure according to a test example in which a spectral overlap between the photoluminescence (PL) spectrum of the phosphorescent dopant PD and the absorption spectrum of a fluorescent dopant FD is large and thus thermally activated delayed fluorescence (TADF) occurs in the fluorescent dopant FD due to Förster energy transfer (FET).

In the structure according to the test example in which energy is transferred from the phosphorescent dopant PD to the fluorescent dopant FD mainly through Förster energy transfer (FET), in order to suppress Dexter energy transfer (DET), the doping concentration of the fluorescent dopant must be maintained below a designated concentration at which Dexter energy transfer (DEF) can occur, and thus, the host must be doped with a very small amount of the fluorescent dopant FD. In this case, processing is not easy and thus it can be difficult to ensure sufficient yield.

However, the organic light emitting device according to the first embodiment of the present invention uses Dexter energy transfer (DEF) as a main energy transfer method between the phosphorescent dopant PD and the fluorescent dopant FD, thus increasing the doping concentration of the fluorescent dopant FD and thereby being favorable in terms of processing.

In the organic light emitting device according to the first embodiment of the present invention, the light emitting layer 130 includes not less than 50 wt % of the host and 0.1 w % to 30 wt % of each of the fluorescent dopant FD and the phosphorescent dopant PD.

The organic light emitting device according to the first embodiment of the present invention realizes both high efficiency through the use of the phosphorescent dopant PD and high color purity and long lifespan through the use of the fluorescent dopant FD.

When the light emitting layer 130 is a blue light emitting layer configured to emit blue light, a blue fluorescent dopant having a narrow full width at half maximum (FWHM) and a blue phosphorescent dopant are used, and thermally activated delayed fluorescence (TADF) occurs using a phosphor-sensitized fluorescence (PSF) method, in which energy is transferred from the triplet energy level of the blue phosphorescent dopant to the triplet energy level of the blue fluorescent dopant through Dexter energy transfer (DET).

Further, the light emitting layer 130 can be configured such that, in addition to the above-described blue light emitting layer, a green light emitting layer or a red light emitting layer includes a host, a phosphorescent dopant and a fluorescent dopant so that the fluorescent dopant ultimately emits light.

Each of the green light emitting layer and the red light emitting layer can use materials for the phosphorescent dopant and the fluorescent dopant in which a difference between emission peak wavelengths thereof falls within the range of 40 nm, so as to realize color purity improvement and efficiency improvement.

The inventors of the invention confirmed that efficiency improvement, color purity improvement and lifespan improvement are acquired using the host, the blue fluorescent dopant and the blue phosphorescent dopant in the light emitting layer by applying the configuration of FIG. 1 or 4. Further, when the light emitting layer 130 is a blue light emitting layer configured to emit blue light, a blue fluorescent dopant having a narrow full width at half maximum (FWHM) and a blue phosphorescent dopant are used, and thermally activated delayed fluorescence (TADF) occurs through the phosphor-sensitized fluorescence (PSF) method, in which energy is transferred from the triplet energy level of the blue phosphorescent dopant to the triplet energy level of the blue fluorescent dopant through Dexter energy transfer (DET).

As examples of the blue fluorescent dopant FD, there are boron-based compounds, shown in the following

[Chemical Formula 1]

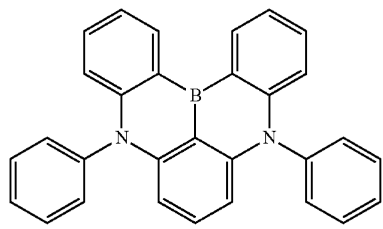

[Chemical Formula 2]

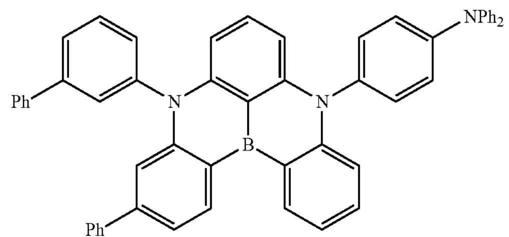

[Chemical Formula 3]

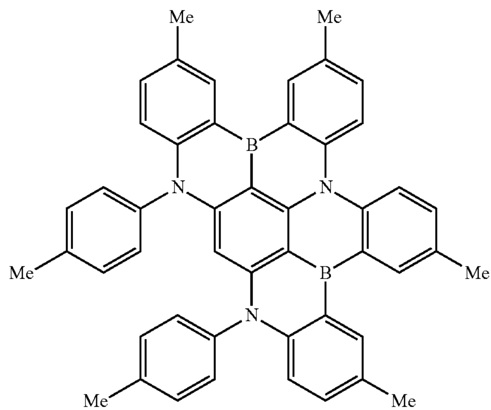

[Chemical Formula 4]

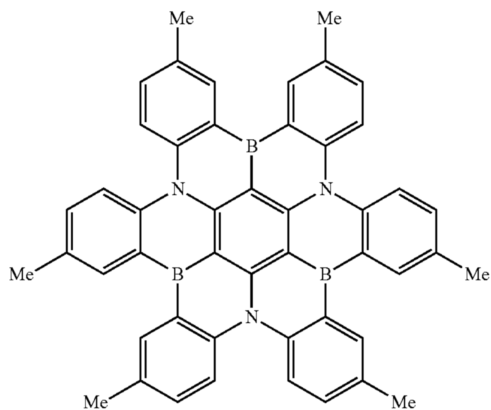

[Chemical Formula 5]

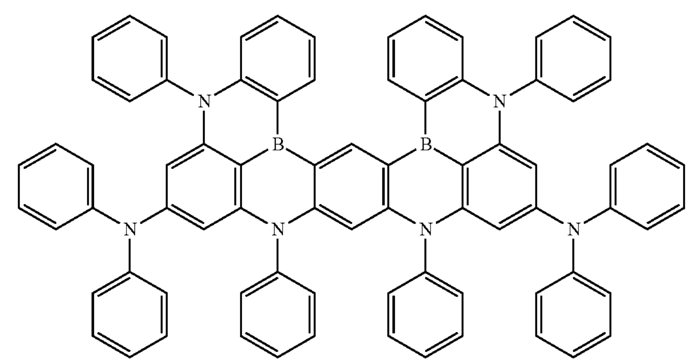

[Chemical Formula 6]
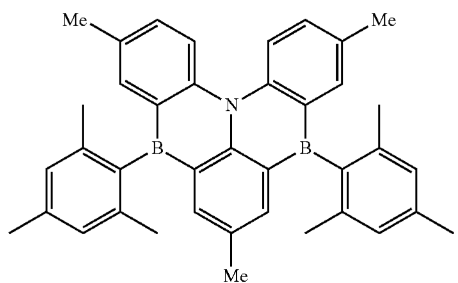
[Chemical Formula 7]
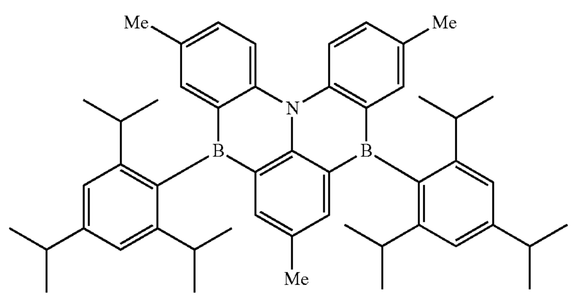
[Chemical Formula 8]
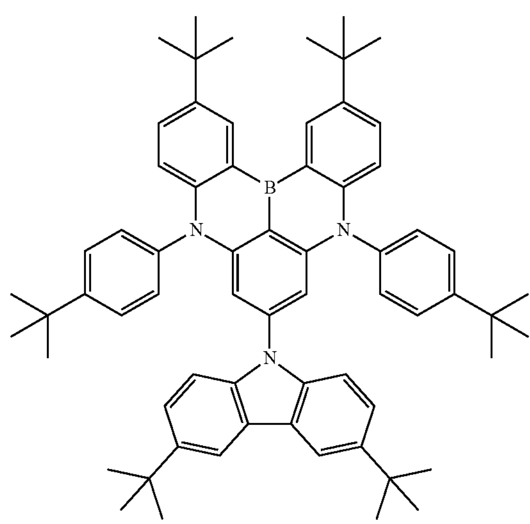
[Chemical Formula 9]
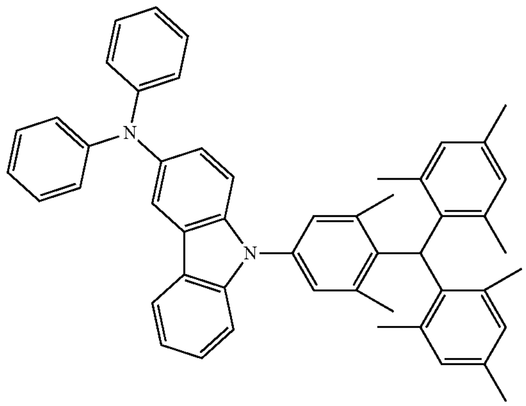
Further, as examples of a green fluorescent dopant used in the green light emitting layer including a host, a green phosphorescent dopant and the green fluorescent dopant, there are compounds shown in the following Chemical Formulas 10 to 13.
[Chemical Formula 10]
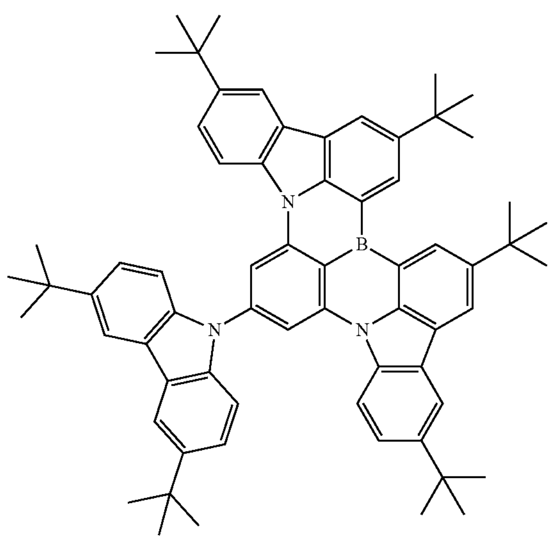

[Chemical Formula 11]

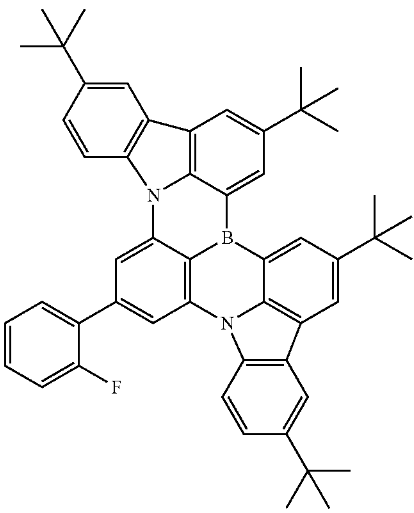

[Chemical Formula 12]

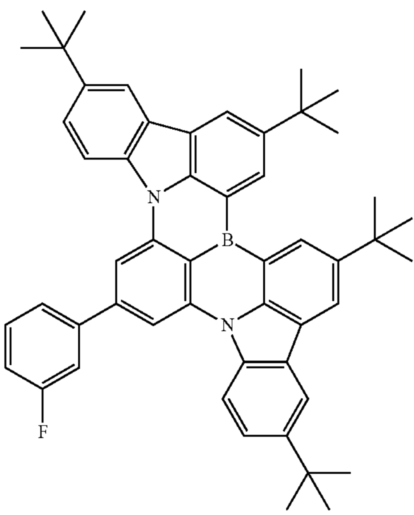

[Chemical Formula 13]

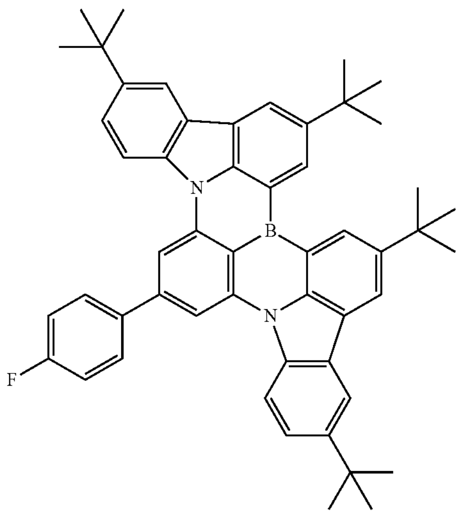

The phosphorescent dopant PD applied to the light emitting layer according to the present invention uses, for example, a metal complex compound including, as a core, iridium (Ir), platinum (Pt), osmium (Os), gold (Au), titanium (Ti), zirconium (Zr), hafnium (Hf), europium (Eu), terbium (Tb), palladium (Pd) or thulium (Tm). Phosphorescent dopants having different colors can be formed of a material having a difference in the emission peak wavelengths from the fluorescent dopant which falls within 40 nm, by changing the configuration of a ligand bonded to metal.

In the light emitting layer of the organic light emitting device according to the present invention, the phosphorescent dopant PD does not directly emit light and transfers energy received from the host and its own excitation energy to the fluorescent dopant FD, and in order to realize the maximum efficiency of the light emitting layer, it is desirable for the phosphorescent dopant PD not to emit light or to emit almost no amount of light.

In test examples which will be described below, an arbitrary phosphorescent dopant was used as the phosphorescent dopant PD and an arbitrary fluorescent dopant was used as the fluorescent dopant FD. An iridium complex compound or a platinum complex compound was used as the phosphorescent dopant PD and a boron-based compound was used as the fluorescent dopant FD, and, in this case, it was confirmed that the phosphorescent dopant PD effectively transfers energy received from the host and its own excitation energy to the triplet excited state of the fluorescent dopant, and the fluorescent dopant FD formed of the boron-based compound simultaneously generates both fluorescence of a single color and thermally activated delayed fluorescence (TADF), as shown in FIG. 2, and thereamong, fluorescence of the single color mainly occurs.

In the light emitting layer of the organic light emitting device according to the present invention, in comparison between the intrinsic PL spectrum of the phosphorescent dopant PD and the intrinsic PL spectrum of the fluorescent dopant FD, as shown in FIG. 3, the fluorescent dopant FD can have a narrow full width at half maximum (FWHM). In the organic light emitting device according to the present invention, light emission is concentrated upon the fluorescent dopant FD, and thus, light emission is realized based on fluorescence characteristics having the narrow full width at half maximum (FWHM) depending on the properties of the fluorescent dopant FD, and this preferably means that high color purity in light emission can be realized.

Further, as shown in FIG. 4, the organic light emitting device according to the second embodiment of the present invention includes a plurality of hosts Host1 and Host2 having different carrier transport characteristics in a light emitting layer 130, and other elements of the organic light emitting device according to the second embodiment are the same as those of the organic light emitting device according to the first embodiment, for example, the light emitting layer 130 further includes a phosphorescent dopant PD and a fluorescent dopant FD in addition to the hosts Host1 and Host2 so as to exhibit the same function in which the fluorescent dopant FD ultimately emits light of a single color. Therefore, a detailed description of some parts in the second embodiment which are substantially the same as those in the first embodiment will be omitted because it is considered to be unnecessary.

Here, the light emitting layer 130 includes the first and second hosts Host1 and Host2 at a total concentration of not less than 50 wt %, and the first and second hosts Host1 and Host 2 adjust transport of carriers, such as holes injected through an adjacent first electrode 110 and electrons injected through an adjacent second electrode 120, and transfer energy from the singlet excited state $S_1$ and the triplet excited state $T_1$ of excitons, generated by recombination between the holes and the electrons in the light emitting layer 130, to the phosphorescent dopant PD and the fluorescent dopant FD. The total concentration of the first and second hosts Host1 and Host 2 can be greater than or equal to the sum of the concentrations of the fluorescent dopant FD and the phosphorescent dopant PD, in order to transfer energy from the first and second hosts Host1 and Host 2 to the dopants PD and FD. Each of the concentration of the phosphorescent dopant PD and the concentration of the fluorescent dopant FD can be 0.1 wt % to 30 wt %.

Hereinafter, the characteristics of the organic light emitting device according to the present invention will be examined through tests.

In the tests, a structure using a single phosphorescent dopant configured to emit blue light, a structure using a single fluorescent dopant configured to emit blue light, and a structure using the phosphorescent and fluorescent dopants of the organic light emitting device according to the present invention were respectively tested.

Figure 5B:
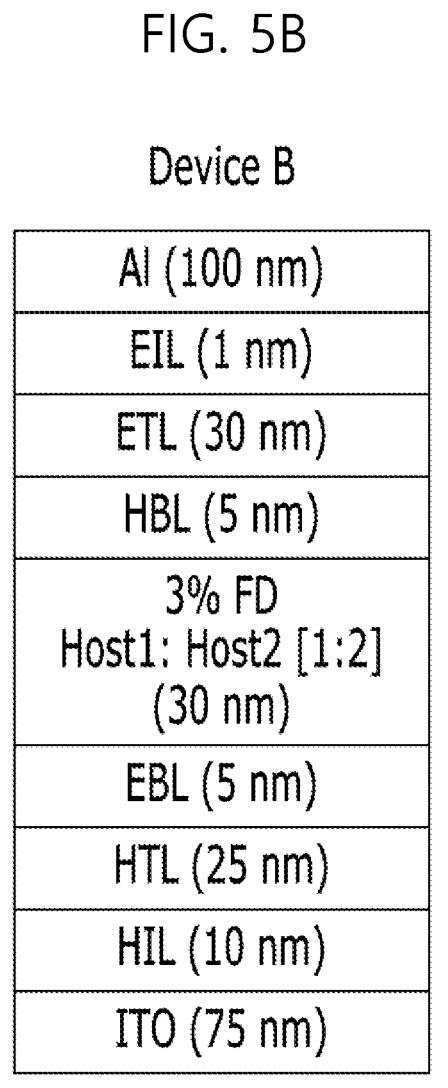
Figure 6:
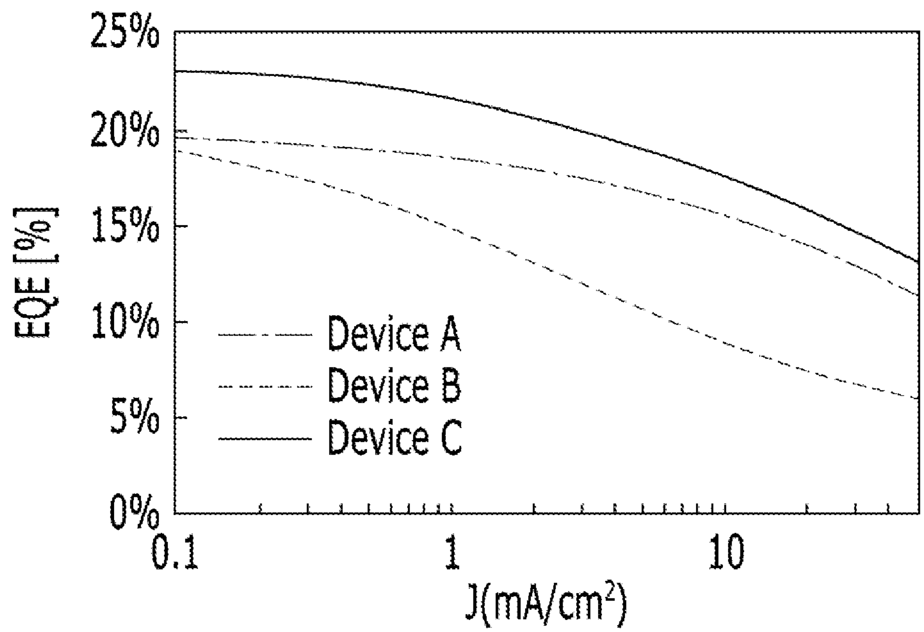
FIG. 6 is a graph showing relationships between current density and internal quantum efficiency in the first to third test examples.
Figure 7:
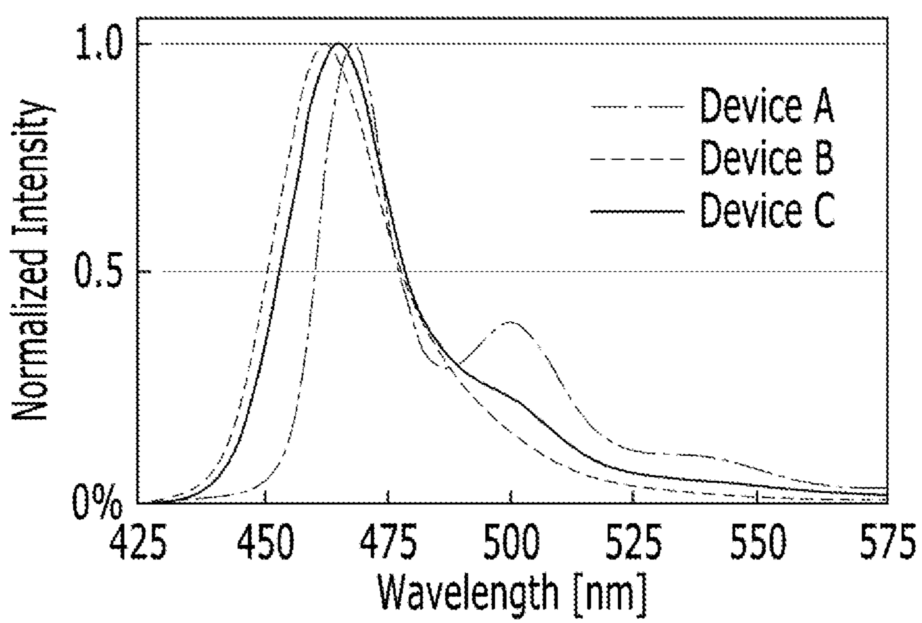
FIG. 7 is a graph showing relationships between wavelength and intensity in the first to third test examples.
Figure 8A:
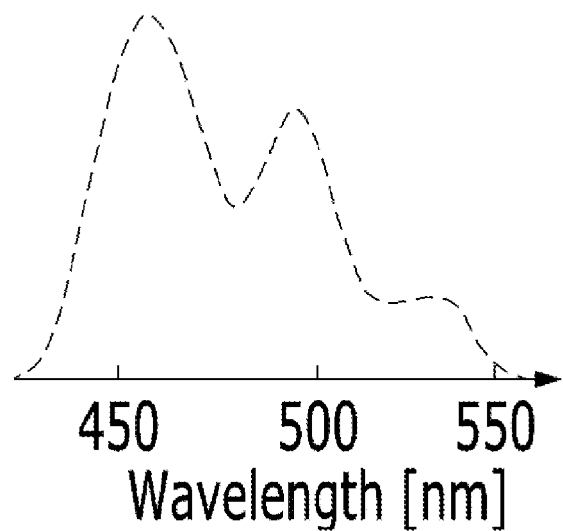
FIGS. 8A to 8C are graphs showing the PL spectra of light emitting layers in the first to third test examples.
Figure 8B:
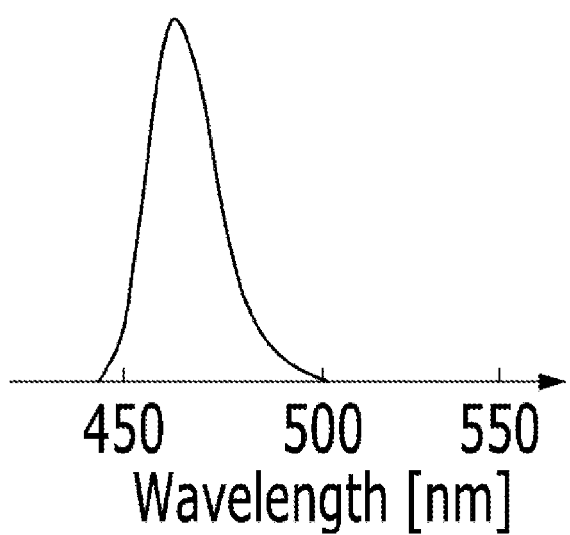
Figure 8C:
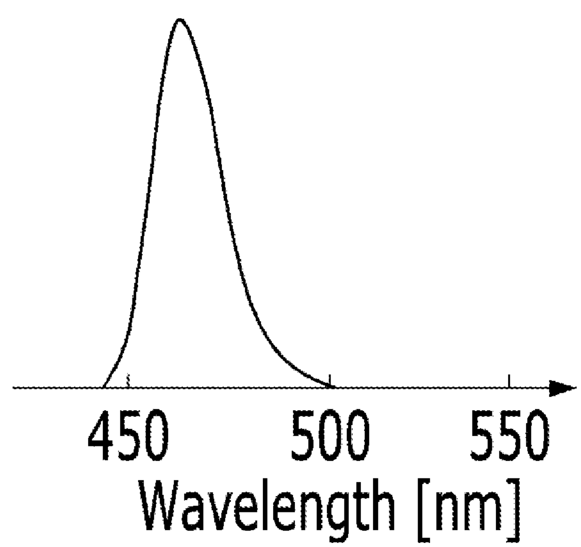

FIGS. 5A to 5C are cross-sectional views illustrating organic light emitting devices according to first to third test examples, and FIG. 6 is a graph showing relationships between current density and internal quantum efficiency in the first to third test examples. FIG. 7 is a graph showing relationships between wavelength and intensity in the first to third test examples, and FIGS. 8A to 8C are graphs showing the PL spectra of light emitting layers in the first to third test examples.

A blue phosphorescent organic light emitting device Device A was used in the first test example, as shown in FIG. 5A, a blue fluorescent organic light emitting device Device B was used in the second test example, as shown in FIG. 5B, and the organic light emitting device Device C according to the second embodiment of the present invention described above with reference to FIG. 4 was used in the third test example, as shown in FIG. 5C.

The organic light emitting devices Devices A, B and C according to the first to third examples commonly include a hole injection layer HIL having a thickness of 10 nm, a hole transport layer HTL having a thickness of 25 nm, an electron blocking layer EBL having a thickness of 5 nm, a light emitting layer having a thickness of 30 nm, a hole blocking layer HBL having a thickness of 5 nm, an electron transport layer ETL having a thickness of 30 nm and an electron injection layer EIL having a thickness of 1 nm, which are sequentially stacked between an ITO electrode serving as an anode and an Al electrode serving as a cathode.

Here, in the organic light emitting devices Devices A, B and C according to the first to third examples, in order to realize the same cavity structure between the ITO electrode and the Al electrode so as to examine characteristics which are varied depending on the dopant configuration of the light emitting layer, the ITO electrode having a thickness of 75 nm and the Al electrode having a thickness of 100 nm were commonly applied in addition to application of the above-described thicknesses of the respective layers.

Further, in the organic light emitting devices Devices A, B and C according to the first to third examples, the light emitting layer uses different kinds of hosts Host1 and Host 2, i.e., a hole transporting host and an electron transporting host, and the amount of the electron transporting host Host2 is twice the amount of the hole transporting host Host1.

Further, the organic light emitting device Device A according to the first test example employed a blue phosphorescent dopant using platinum as a core thereof and having a concentration of 10 wt % in the light emitting layer, the organic light emitting device Device B according to the second test example employed a boron-based blue fluorescent dopant formed of the compound shown in Chemical Formula 2 and having a concentration of 3 wt, in the light emitting layer, and the organic light emitting device Device C according to the third test example employed the blue phosphorescent dopant using platinum as a core thereof and having a concentration of 10 wt % in the light emitting layer and the boron-based blue fluorescent dopant formed of the compound shown in Chemical Formula 2 and having a concentration of 3 wt % in the light emitting layer.

TABLE 1

| | Current density (at 10 mA/cm$^2$) | | | | | |
|---|---|---|---|---|---|---|
| Division | λmax [nm] | CIEx | CIEy | EQE (%) | Luminance [Cd/A] | Blue index |
| Device A | 468 | 0.143 | 0.223 | 15.1 | 23.3 | 105 |
| Device B | 462 | 0.133 | 0.086 | 9.0 | 6.9 | 80 |
| Device C | 464 | 0.136 | 0.120 | 17.5 | 17.5 | 146 |

As shown in FIG. 6 and Table 1, it can be confirmed that external quantum efficiency (EQE) is highest in the organic light emitting device Device C according to the third test example, and is decreased in order of the phosphorescent organic light emitting device Device A according to the first test example and the fluorescent organic light emitting device Device B according to the second test example. As the current density is increased, the external quantum efficiencies (EQE) of the organic light emitting devices Devices A, B and C according to the first to third test examples tend to be decreased, but it can be confirmed that the external quantum efficiency (EQE) of the organic light emitting device Device C according to the third test example is decreased slowly as compared to the organic light emitting devices Device A and B according to the first and second test examples and thereby the structure using both phosphorescent and fluorescent dopants like the organic light emitting device according to the present invention is effective against efficiency change corresponding to current density change. Referring to FIG. 7 showing the PL spectra of the organic light emitting devices Devices A, B and C according to the first to third test examples, it can be confirmed that a shoulder occurs at a wavelength, i.e., about 500 nm, other than blue wavelengths in the phosphorescent organic light emitting device A according to the first test example, which preferably means lowering of blue color purity in the phosphorescent organic light emitting device A according to the first test example.

Particularly, in connection with CIEy data in Table 1, a CIEy value was 0.223 in the phosphorescent organic light emitting device A according to the first test example, and indicates that light deviating from blue wavelengths was emitted.

From Table 1, it can be confirmed that the internal quantum efficiency of the organic light emitting device Device C according to the third test example which employs the organic light emitting device according to the second embodiment of the present invention is significantly improved as compared to the organic light emitting devices Devices A and B according to the first and second test examples, and particularly, color purity of the organic light emitting device Device C according to the third test example is maintained similar to that of the fluorescent organic light emitting device Device B according to the second test example and efficiency of the organic light emitting device Device C according to the third test example is increased to be at least doubled compared to that of the fluorescent organic light emitting device Device B according to the second test example. Here, λmax indicates an emission peak wavelength of each of the respective organic light emitting devices, and it may be understood that the organic light emitting device Device C according to the third test example uses both the phosphorescent dopant and the fluorescent dopant used in the organic light emitting devices Devices A and B according to the first and second test examples but the emission peak wavelength of the organic light emitting device Device C is not the average values of the emission peak wavelengths of the organic light emitting devices Devices A and B but is close to the emission peak wavelength of the organic light emitting device Device B. These emission peak wavelength properties indicate that light emission is mainly concentrated upon the fluorescent dopant together with the CIEy value of Table 1, in the structure using both the fluorescent dopant and the phosphorescent dopant according to the present invention.

Here, a blue index is a value acquired by dividing the luminance value of the organic light emitting device according to each test example by the CIEy value thereof, i.e., indicating contrast effects between luminance and color purity, and preferably means that, as the Blue index value is increased, luminance efficiency is increased in expression of the same color. From Table 1, it can be confirmed that the Blue index value of the organic light emitting device Device C according to the third test example is the highest.

In the above-described test examples, a material having a triplet energy level of 2.66 eV was used as the phosphorescent dopant and a material having a triplet energy level of 2.58 eV was used as the fluorescent dopant, and this preferably means that the organic light emitting device Device C according to the third test example satisfies a triplet energy level condition in which Dexter energy transfer (DET) among the host, the phosphorescent dopant and the fluorescent dopant shown in FIG. 2 is facilitated.

Further, FIGS. 8A to 8C show the PL spectra of light emitting layers according to the first to third test examples, and thereby it can be confirmed that color purity of the phosphorescent organic light emitting device Device A according to the first test example is lowered. On the other hand, it can be confirmed that the fluorescent organic light emitting device Device B according to the second test example and the organic light emitting device Device C according to the third test example, in which light emission is concentrated upon the fluorescent dopant by energy transfer to the fluorescent dopant, have high color purity.

Hereinafter, characteristics of the phosphorescent organic light emitting device and the fluorescent organic light emitting device in connection with energy level characteristics will be described.

Figure 9A:
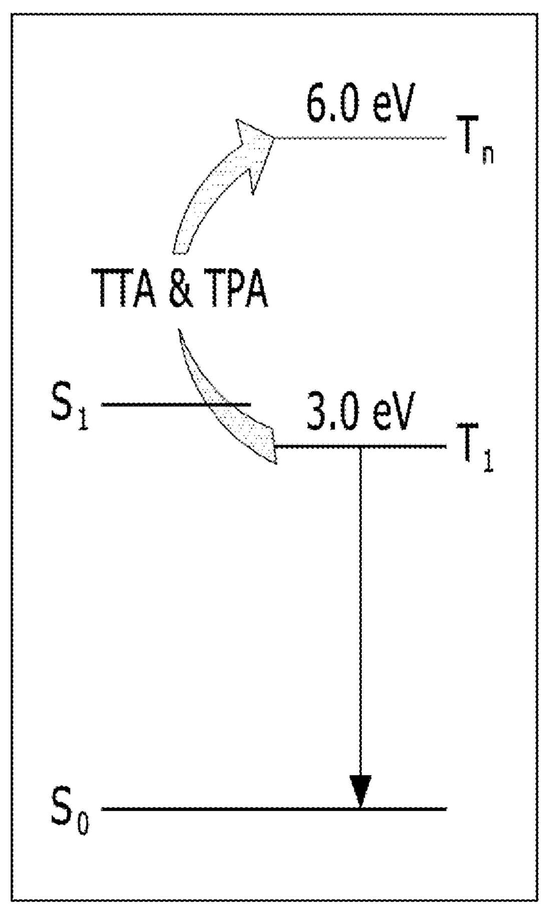
FIGS. 9A and 9B are views illustrating the luminescence mechanisms of a blue phosphorescent organic light emitting device and a blue fluorescent organic light emitting device.
Figure 9B:
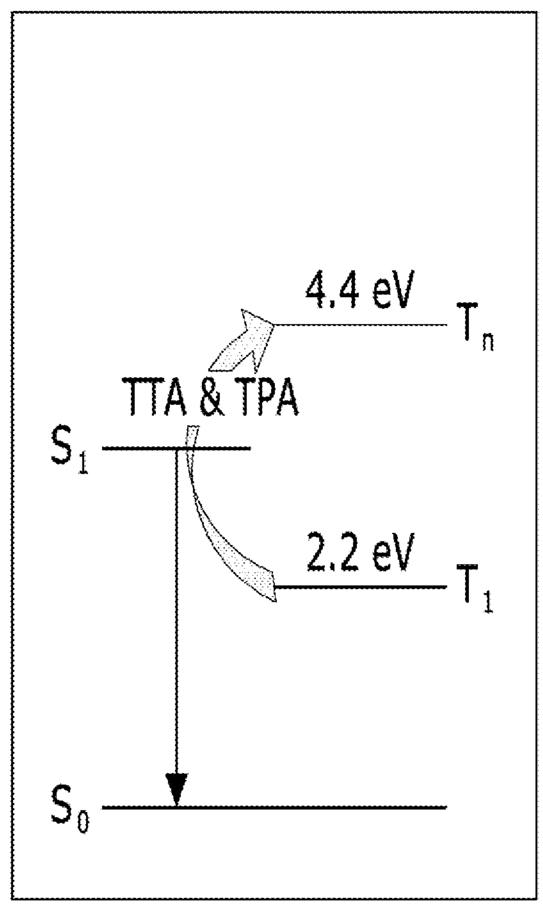
Figure 10:
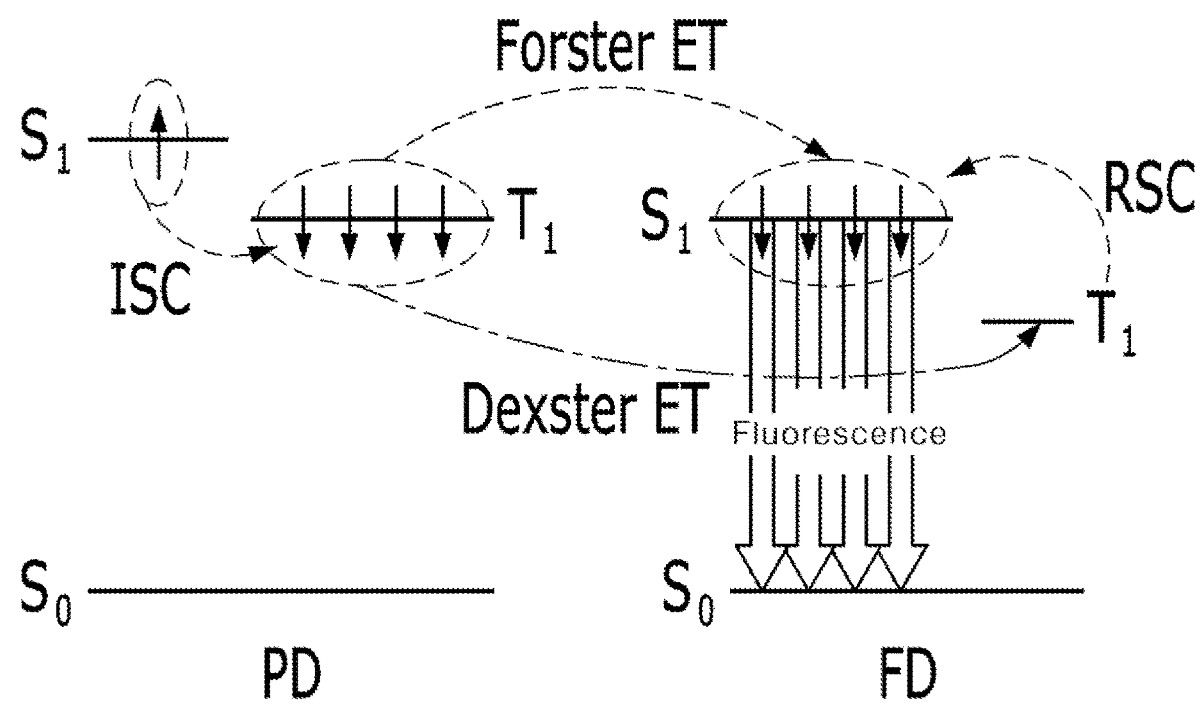
FIG. 10 is a view illustrating the luminescence mechanism of an organic light emitting device according to the present invention.

FIGS. 9A and 9B are views illustrating the luminescence mechanisms of the blue phosphorescent organic light emitting device and the blue fluorescent organic light emitting device, and FIG. 10 is a view illustrating the luminescence mechanism of the organic light emitting device according to the present invention.

As shown in FIG. 9A, in the blue phosphorescent organic light emitting device, light emission mainly occurs due to energy transfer from the triplet energy level $T_1$ to the ground state $S_0$. Here, the triplet energy level $T_i$ of the blue phosphorescent dopant is about 3.0 eV, and it takes a long time for excitons to become extinct in the phosphorescent organic light emitting device, and thus, excitons, which are not immediately used in excitation and remain in the light emitting layer, meet and reach a hot excited state energy level $T_n$, which is about twice the triplet energy level $T_1$, i.e., 6.0 eV.

Further, in the blue phosphorescent organic light emitting device, the phosphorescent dopant does not have high color purity, and in order to implement a dark blue color, a triplet energy level of about 3.0 eV or higher is required. Here, because of characteristics of the phosphorescent dopant having long extinction time, triplet-triplet annihilation (TTA) easily occurs and thus the hot excited state energy level corresponding to twice the triplet energy level is generated, thereby deteriorating the phosphorescent dopant and causing reduction in the lifespan of the blue phosphorescent organic light emitting device. In addition, the long extinction time of the excitons causes triplet-triplet annihilation (TTA), in which triplet excitons meet each other and are thus annihilated, or triplet-polaron-annihilation (TPA), in which triplet excitons and polarons in a polar molecule state meet and are thus annihilated, occur and thus the material for the phosphorescent dopant is deteriorated and the lifespan of the blue phosphorescent organic light emitting device is shortened. Particularly, when the hot excited state energy level $T_n$ becomes 6.0 eV or higher, the hot excited state energy level $T_n$ is higher than the ligand dissociation energy of the corresponding dopant, and ligand dissociation, in which bonds between (heavy) metal and ligands of the dopant are dissociated, occurs, thereby further reducing the lifespan of the blue phosphorescent organic light emitting device.

On the other hand, as shown in FIG. 9B, in the blue fluorescent organic light emitting device, light emission mainly occurs due to energy transfer from the singlet energy level $S_1$ to the ground state $S_0$ very quickly within a very short time of a few nanoseconds, and thus there are no singlet excitons remaining in the light emitting layer. Further, the hot excited state energy level $T_n$ is very low, i.e., about 4.4 eV, and is lower than the ligand dissociation energy of the corresponding dopant, ligand dissociation rarely occurs and thus does not cause triplet-triplet annihilation (TTA) or triplet-polaron-annihilation (TPA), which occurs in the blue phosphorescent organic light emitting device, is prevented, thereby preventing a reduction in the lifespan of the blue fluorescent organic light emitting device compared to the blue phosphorescent organic light emitting device. Therefore, since the blue fluorescent organic light emitting device has a longer lifespan than the blue phosphorescent organic light emitting device, the blue fluorescent organic light emitting device is considered for implementation as a blue organic light emitting device in preference to the blue phosphorescent organic light emitting device.

However, as shown in FIG. 10, in the organic light emitting device according to the present invention, energy of excitons located in the triplet energy level T1 in the phosphorescent dopant PD is transferred to excitons in the fluorescent dopant FD through Dexter energy transfer (DET) and is thus used to generate thermally activated delayed fluorescence (TADF), and both thermally activated delayed fluorescence (TADF) and fluorescence of the fluorescent dopant FD itself are used to emit light without energy dissipation, and thereby, it can be confirmed that both the internal quantum efficiency and the luminance of the organic light emitting device according to the present invention can be at least doubled compared to those of the blue fluorescent organic light emitting device. This can be confirmed from Table 1 above.

Further, in the organic light emitting device according to the present invention, as shown in FIGS. 2 and 10, the triplet energy level $T_1$ of the phosphorescent dopant PD can be equal to or higher than the triplet energy level $T_1$ of the fluorescent dopant FD but does not need to be higher than the singlet energy level of the fluorescent dopant FD, and thus, the phosphorescent dopant used in the light emitting layer according to the present invention can be selected from materials having a comparatively low triplet energy level, about 2.9 eV or less, and deterioration of the lifespan occurring in the phosphorescent organic light emitting device having the high triplet energy level shown in FIG. 9A can be prevented.

Because this tendency is relatively severe in the blue phosphorescent organic light emitting device, a red phosphorescent organic light emitting device and a green phosphorescent organic light emitting device exhibit a triplet energy level of 2.5 eV or less, and can thus improve lifespan deterioration or ligand dissociation. However, even in the red phosphorescent organic light emitting device and the green phosphorescent organic light emitting device, TTA or TPA can occur, and thus, when the hosts, the phosphorescent dopant and the fluorescent dopant of the light emitting layer structure according to the present invention are applied to the organic light emitting device configured to emit green or red light so that light emission is concentrated upon the fluorescent dopant, the above-described problems with the phosphorescent organic light emitting device can be solved and thus lifespan improvement can be expected.

Hereinafter, other embodiments of the present invention will be described.

Figure 11:
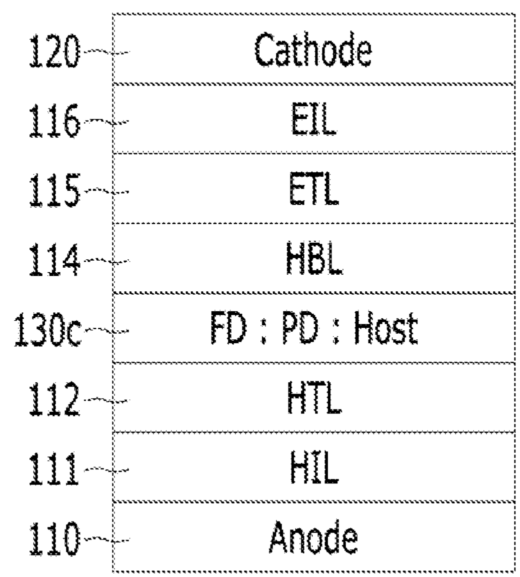
FIG. 11 is a cross-sectional view illustrating an organic light emitting device according to a third embodiment of the present invention.
Figure 12:
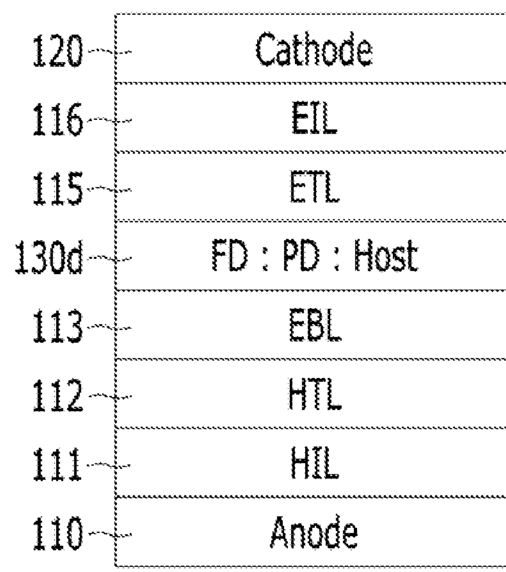
FIG. 12 is a cross-sectional view illustrating an organic light emitting device according to a fourth embodiment of the present invention.

FIGS. 11 and 12 are cross-sectional views illustrating organic light emitting devices according to third and fourth embodiments of the present invention.

As shown in FIG. 11, the organic light emitting device according to the third embodiment of the present invention is configured such that the lower surface of a light emitting layer 130*c* directly contacts a hole transport layer 112 without an electron blocking layer 113, unlike the first embodiment. For example, the light emitting layer 130*c* contacts the hole transport layer 112.

The organic light emitting device according to the third embodiment can use two or more kinds of hosts together with the fluorescent dopant FD and the phosphorescent dopant PD, in the same manner as the second embodiment.

Further, as shown in FIG. 12, the organic light emitting device according to the fourth embodiment of the present invention is configured such that the lower surface of a light emitting layer 130*d* directly contacts an electron blocking layer 113 and the upper surface of the light emitting layer 130*d* directly contacts an electron transport layer 115 without a hole blocking layer 114, unlike the first embodiment. As s modified embodiment to the fourth embodiment, a light emitting layer 130*d* can directly contact a hole transport layer 112 under the light emitting layer 130*d* without an electron blocking layer 113, and can directly contact an electron transport layer 115 above the light emitting layer 130*d* without a hole blocking layer.

The organic light emitting device according to the fourth embodiment can use two or more kinds of hosts together with the fluorescent dopant FD and the phosphorescent dopant PD, in the same manner as the second embodiment.

Further, the above-described organic light emitting devices according to the first to fourth embodiments have common characteristics in that the host(s) and different kinds of first and second dopants, i.e., the phosphorescent dopant and the fluorescent dopant, are used and energy transfer is concentrated upon the fluorescent dopant, in which thermally activated delayed fluorescence (TADF) is realized, and thereby exhibit a common effect in which both fluorescence of the fluorescent dopant itself and thermally activated delayed fluorescence (TADF) occur simultaneously in the fluorescent dopant and thus light of a single color can be emitted.

Hereinafter, an example in which the organic light emitting device according to the present invention is applied to a display device will be described.

Figure 13:
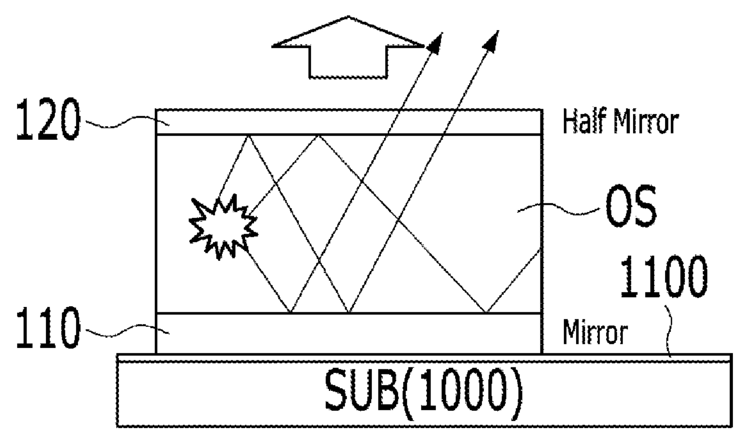
FIG. 13 is a cross-sectional view illustrating a display device according to a first embodiment of the present invention.

FIG. 13 is a cross-sectional view illustrating a display device according to a first embodiment of the present invention.

As shown in FIG. 13, the display device according to the first embodiment of the present invention includes one of the light emitting layers 130, 130*c* and 130*d* according to the above-described first to fourth embodiments or a light emitting layer modified therefrom, provided between a first electrode 110 and a second electrode 110 provided on a thin film transistor array substrate 1000.

The thin film transistor array substrate 1000 includes a plurality of subpixels, and each subpixel includes at least one thin film transistor configured to drive an organic light emitting diode including the first electrode 110, the second electrode 120 and an organic stack OS provided between the first and second electrodes 110 and 120.

A buffer layer 1100 for planarization can be further provided between the thin film transistor array substrate 1000 and the organic light emitting diodes. When the buffer layer 1100 is provided, the thin film transistor of each subpixel of the thin film transistor array substrate 1000 may pass through the buffer electrode 1100 and be connected to the first electrode 1100.

In the example shown in FIG. 13, the first electrode 110 includes a reflective electrode and is thus used as a mirror having a reflective function and the second electrode 120 includes a transflective electrode, and thus, the display device has a cavity structure in which light can undergo reflection and resonance between the first and second electrodes 110 and 120 and is transmitted upwards in a specific wavelength range.

Further, the organic stack OS has the light emitting layer including the above-described host(s), phosphorescent dopant PD and the fluorescent dopant FD provided at a designated position, and, in the light emitting layer, the fluorescent dopant FD emits light of the corresponding wavelengths.

In the light emitting layer used in the present invention, particularly, the full width at half maximum (FWHM) of the fluorescent dopant FD is narrow, i.e., about 40 nm or less, and thus, even in the cavity structure, light can be emitted without optical loss.

Figure 14:
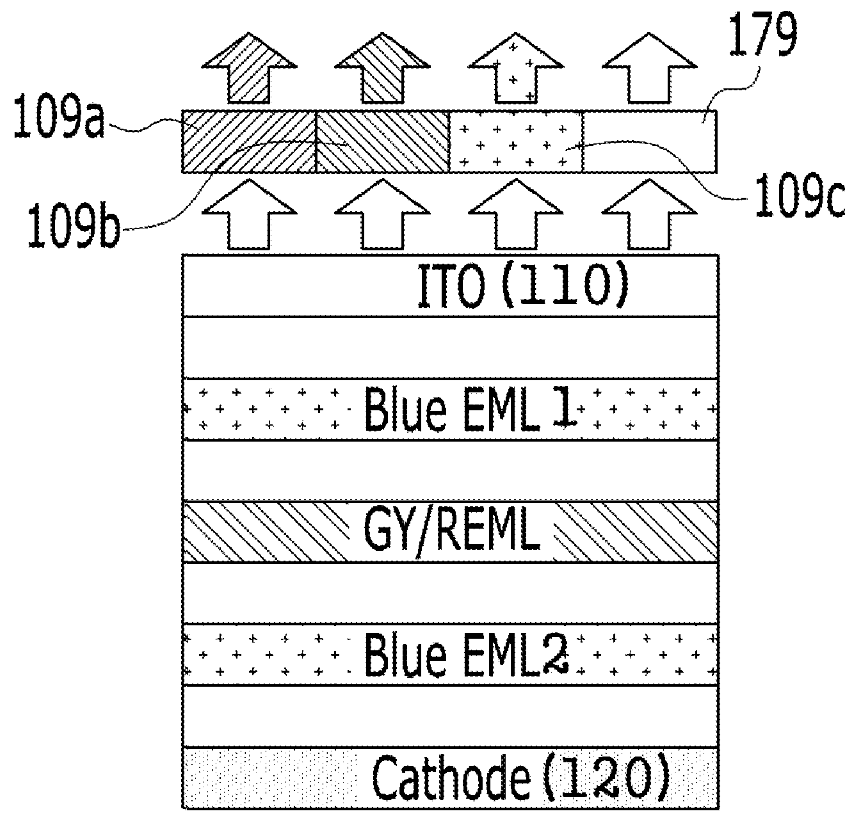
FIG. 14 is a cross-sectional view illustrating a display device according to a second embodiment of the present invention.
Figure 15:
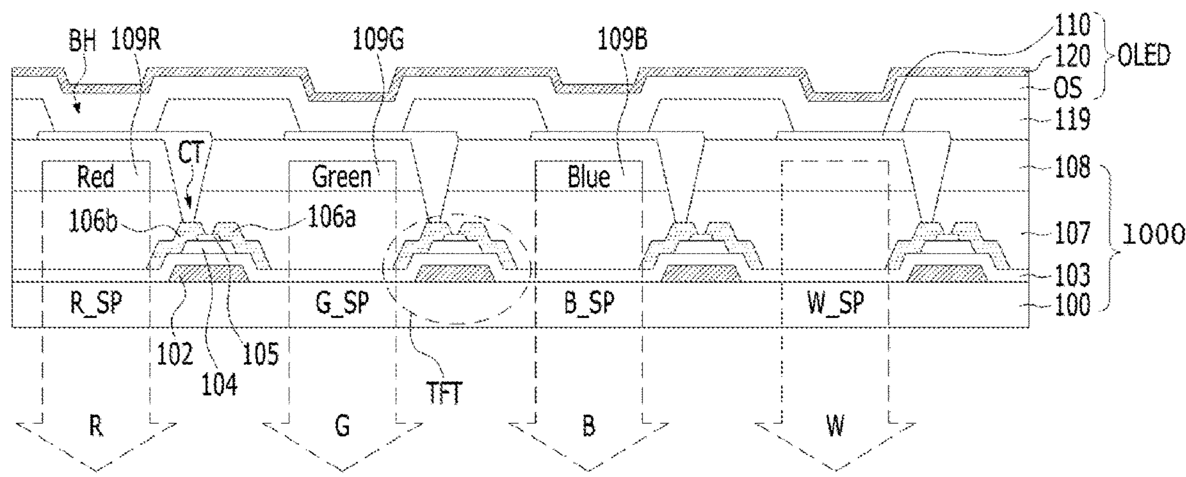
FIG. 15 is a cross-sectional view illustrating one type of the display device shown in FIG. 14.

FIG. 14 is a cross-sectional view illustrating a display device according to a second embodiment of the present invention, and FIG. 15 is a cross-sectional view illustrating one type of the display device shown in FIG. 14.

As shown in FIG. 14, the display device according to the second embodiment includes common layers among a plurality of light emitting layers Blue EML1, GY/REML and Blue EML2 provided between a first electrode 110 and a second electrode 120 so as to emit white light therethrough, and color filters 109*a*, 109*b* and 109*c* provided at the light-emitting side of the display device so as to emit light of different colors depending on subpixels.

In the illustrated example, a thin film transistor array substrate 1000 is provided at the light-emitting side of the display device, and the thin film transistor array substrate 1000 is located on the color filters 109*a*, 109*b* and 109*c* based on FIG. 14. Here, reference numeral 179 indicates a transparent film having a thickness equal to or similar to the thickness of the color filters 109*a*, 109*b* and 109*c* so as to prevent generation of a surface step between the subpixels of an array formed after formation of the color filters 109*a*, 109*b* and 109*c* and the transparent film 179, and the transparent film 179 can be omitted depending on circumstances.

Further, if energy is transferred from the host(s) and the phosphorescent dopant to the fluorescent dopant and the full width at half maximum (FWHM) of the fluorescent dopant is narrow like the light emitting layer according to the present invention, even when the color filters are omitted from the corresponding subpixels, the subpixels are capable of emitting light in a narrow wavelength range.

As shown in FIG. 15, the display device according to the present invention can include a substrate 100 having a plurality of subpixels R_SP, G_SP, B_SP and W_SP, the organic light emitting diodes OLEDs of FIG. 13 or 14 provided in common on the substrate 100, thin film transistors TFTs respectively provided in the subpixels and connected to the first electrode 110 of the organic light emitting diodes OLEDs, and a color filter layer 109R, 109G and 109B provided under the first electrode 110 of at least one of the subpixels.

Although the illustrated example shows that the display device includes a white subpixel W_SP, the disclosure is not limited thereto, and the display device can have a structure including only red, green and blue subpixels R_SP, G_SP and B_SP without the white subpixel W_SP. As circumstances require, a combination of a cyan subpixel, a magenta subpixel and a yellow subpixel, which are combined to express white, can be used as a substitute for the red, green and blue subpixels R_SP, G_SP and B_SP.

The thin film transistor TFT includes, for example, a gate electrode 102, a semiconductor layer 104, and a source electrode 106*a* and a drain electrode 106*b* connected to both sides of the semiconductor layer 104.

A gate insulating film 103 is provided between the gate electrode 102 and the semiconductor layer 104.

The semiconductor layer 104 can be formed of, for example, amorphous silicon, polycrystalline silicon, an oxide semiconductor, or a combination of two or more thereof. For example, if the semiconductor layer 104 is formed of an oxide semiconductor, an edge stopper 105 directly contacting the upper surface of the semiconductor layer 104 can be further provided so as to prevent damage to a channel region of the semiconductor layer 104.

Further, the drain electrode 106*b* of the thin film transistor TFT can be connected to the first electrode 110 by a contact hole CT formed within first and second protective films 107 and 108.

The first protective film 107 is provided so as to primarily protect the thin film transistors TFT, and color filters 109R, 109G and 109B can be provided on the upper surface of the first protective film 107.

When the subpixels include the red subpixel R_SP, the green subpixel G_SP, the blue subpixel B_SP and the white subpixel W_SP, first and third color filters 109R, 109G and 109B divided from the color filter layer are provided in the remaining subpixels R_SP, G_SP and B_SP, except for the white subpixel W_SP, and transmit respective wavelengths of white light emitted via the first electrode 110. Further, the second protective film 108 is provided on the lower surface of the first electrode 110 so as to cover the first to third color filters 109R, 109G and 109B. The first electrode 110 is formed on the surface of the second protective film 108 except for the contact holes CT.

Figure 16A:
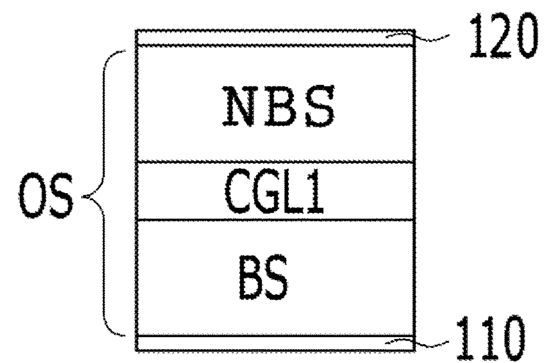
FIGS. 16A to 16C are cross-sectional views illustrating various embodiments of an organic stack applied to the display device according to the present invention.
Figure 16B:
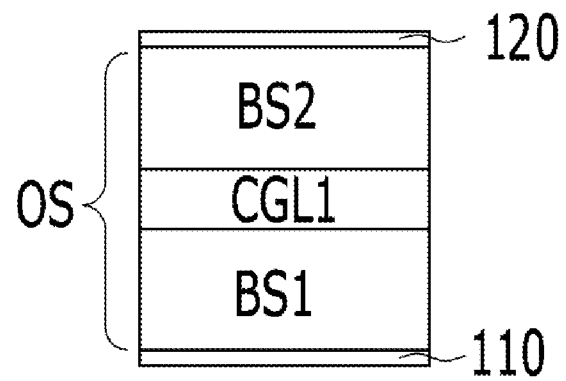
Figure 16C:
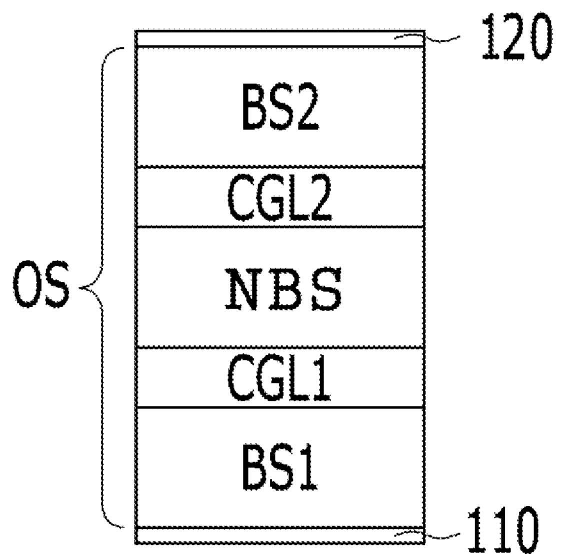

Here, the white organic light emitting diode OLED can include the first electrode 110 which is a transparent electrode, the second electrode 120 which is a reflective electrode arranged opposite the first electrode 110, and as shown in FIG. 16A, a two-stack structure including a blue light emitting stack and a long-wavelength (R/G or YG) light emitting stack or as shown in FIG. 16C, a three-stack structure including a first blue light emitting stack, a long-wavelength light emitting stack and a second blue light emitting stack.

Here, undescribed reference numeral 119 indicates banks, and BH between the banks 119 indicates bank holes. Light is emitted through an open area in the bank hole BH, and the bank hole BH defines an emission area of each subpixel.

For example, the display device shown in FIG. 15 can be a bottom emission-type display device.

However, the display device according to the present invention is not limited thereto, and can be implemented as a top emission-type display device by locating the color filter layer on the upper surface of the second electrode 120, forming the first electrode 110 of a reflective metal and forming the second electrode 110 of a transparent metal or a transflective metal in the structure of the display device shown in FIG. 15.

Otherwise, a transparent organic light emitting device can be implemented by providing or omitting the color filter layer and embodying the first and second electrodes 110 and 120 as transparent electrodes.

Further, a dopant having a higher triplet energy level $E_T$ has a wide full width at half maximum (FWHM), and a dopant having a lower triplet energy level $E_T$ has a narrow full width at half maximum (FWHM).

For example, a first blue phosphorescent dopant having a wide full width at half maximum (FWHM) of 68 nm can have a triplet energy level of about 3.08 eV, and a second blue phosphorescent dopant having a narrow full width at half maximum (FWHM) of 29 nm can have a triplet energy level of about 2.82 eV. A triplet energy level difference between the first and second blue phosphorescent dopants is 0.26 eV, and a hot excited state energy level $T_n$ therebetween is doubled. When the second blue phosphorescent dopant has a narrow full width at half maximum (FWHM) and thus has a low triplet energy level, ligand dissociation, which occurs in the first blue phosphorescent dopant having the relatively wide full width at half maximum (FWHM), does not occur in the second blue phosphorescent dopant, and thereby, the lifespan of a device having the structure using the phosphorescent dopant having the narrow full width at half maximum (FWHM) is expected to be prolonged.

In the organic light emitting device according to the present invention, the triplet energy level of the phosphorescent dopant can be equal to or higher than the triplet energy level of the fluorescent dopant and does not need to be higher than the singlet energy level of the fluorescent dopant, and thus, the phosphorescent dopant does not require a high triplet energy level and it is easy to design stabilized molecules of the phosphorescent dopant. Further, the phosphorescent dopant can have a narrow full width at half maximum (FWHM) like the fluorescent dopant, and thus lower the triplet energy level thereof.

Hereinafter, various embodiments of an organic stack OS applied to the display device according to the present invention will be described.

FIGS. 16A to 16C are cross-sectional views illustrating these embodiments of the organic stack applied to the display device according to the present invention.

FIG. 16A illustrates a display device in which a blue stack BS, a non-blue stack NBS, and a charge generation layer CGL1 located between the blue stack BS and the non-blue stack NBS are provided between a first electrode 110 and a second electrode 120, and at least one of the blue stack BS and the non-blue stack NBS includes the configuration from the hole injection layer 111 to the electron injection layer 116 of one of the above-described first to fourth embodiments or the modified embodiments thereof.

Here, the blue stack BS includes a blue light emitting layer, and the blue light emitting layer includes a blue host, a blue phosphorescent dopant and a blue fluorescent dopant which can have the energy level relationships shown in FIG. 2.

Further, the non-blue stack NBS can include, for example, a red light emitting layer, a green light emitting layer or a yellowish green layer, or include a plurality of different light emitting layers. At least one of the light emitting layers of the non-blue stack NBS can include a host, a phosphorescent dopant and a fluorescent dopant which can have the energy level relationships shown in FIG. 2.

Further, FIG. 16B illustrates a display device having another stack structure in which a first blue stack BS1, a second blue stack BS2, and a charge generation layer CGL1 located between the first blue stack BS1 and the second blue stack BS2 are provided between a first electrode 110 and a second electrode 120.

Here, each of the first and second blue stacks BS1 and BS2 includes a blue light emitting layer, and the blue light emitting layer of at least one of the first and second blue stacks BS1 and BS2 includes a blue host, a blue phosphorescent dopant and a blue fluorescent dopant which can have the energy level relationships shown in FIG. 2.

In addition, FIG. 16C illustrates a display device having yet another stack structure in which a first blue stack BS1, a non-blue stack NBS, a second blue stack BS2, and charge generation layers CGL1 and CGL2 located between the respective stacks BS1, NBS and BS2 are provided between a first electrode 110 and a second electrode 120.

Here, each of the first and second blue stacks BS1 and BS2 includes a blue light emitting layer.

Further, the non-blue stack NBS can include, for example, a red light emitting layer, a green light emitting layer or a yellowish green layer, or include a plurality of different light emitting layers. At least one of the light emitting layers of the non-blue stack NBS can include a host, a phosphorescent dopant and a fluorescent dopant which can have the energy level relationships shown in FIG. 2.

Further, in the embodiment of FIG. 16C, at least one of the light emitting layers of the first and second blue stacks BS1 and BS2 and the non-blue stack NBS can include a host, a phosphorescent dopant and a fluorescent dopant which can have the energy level relationships shown in FIG. 2.

The embodiment of FIG. 16C illustrates one example of a three-stack structure, and, as modified examples, the first and second blue stacks BS1 and BS2 can be provided adjacent to each other, and when the first and second blue stacks BS1 and BS2 are provided adjacent to each other, the first and second blue stacks BS1 and BS2 can be provided adjacent to the first electrode 110 or the second electrode 120.

Further, the number of blue stacks and non-blue stacks can be increased as needed, and a stack structure including more than three stacks can be provided between the first and second electrodes 110 and 120.

The light emitting layer according to the present invention includes a host, a phosphorescent dopant and a fluorescent dopant which can have the energy level relationships shown in FIG. 2, and can be one of the light emitting layers according to embodiments in which light emission occurs mainly in the fluorescent dopant and thermally activated delayed fluorescence (TADF) occurs in the fluorescent dopant through Dexter energy transfer (DEF) from the phosphorescent dopant to the fluorescent dopant.

FIGS. 16A and 16C illustrate examples in which organic light emitting devices included in the light emitting display device include white organic light emitting devices, and FIG. 16B illustrates an example in which a plurality of blue light emitting stacks is provided. A desired structure can be selected depending on whether or not the lifespan or efficiency of the display device is prioritized depending on the model of the display device.

Figure 17:
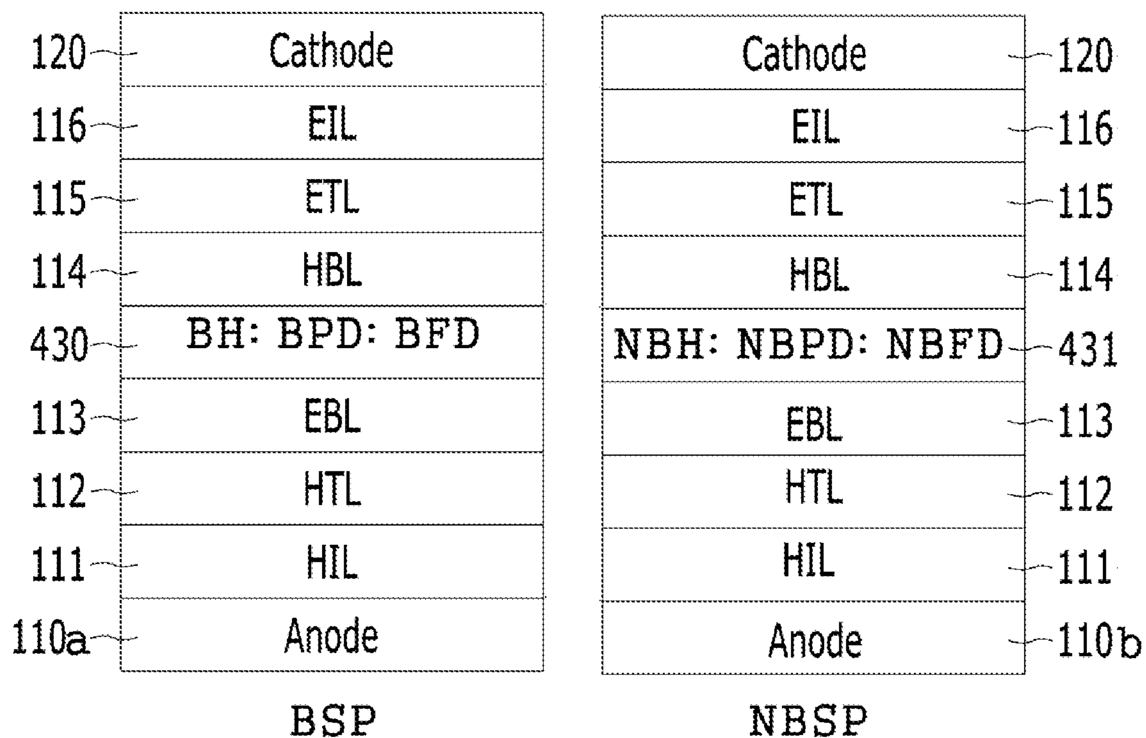
FIG. 17 is a cross-sectional view illustrating light emitting devices in different subpixels of a display device according to a third embodiment of the present invention.

FIG. 17 is a cross-sectional view illustrating light emitting devices in different subpixels of a display device according to a third embodiment of the present invention.

As shown in FIG. 17, in the display device according to the third embodiment of the present invention, light emitting stacks including the above-described light emitting layer are stacked, and different subpixels BSP and NBSP have different stack structures.

For example, a blue subpixel BSP has a blue light emitting layer 430 including a blue host BH, a blue phosphorescent dopant BPD and a blue fluorescent dopant BFD which can have the energy level relationships shown in FIG. 2. Further, a non-blue subpixel NBSP has a non-blue light emitting layer 431 including a non-blue host NBH, a non-blue phosphorescent dopant NBPD and a non-blue fluorescent dopant NBFD which can have the energy level relationships shown in FIG. 2. In this case, the non-blue light emitting layer 431 can be, for example, a red light emitting layer or a green light emitting layer, and both the lifespan and the efficiency of the organic light emitting device can be improved by applying different kinds of dopants to the non-blue light emitting layer 431.

As described above, an organic light emitting device according to the present invention can include a light emitting layer provided between a first electrode and a second electrode arranged opposite each other, and the light emitting layer can include at least one host, a phosphorescent dopant configured to have a first triplet energy level, and a fluorescent dopant configured to have a second triplet energy level lower than the first triplet energy level and to generate thermally activated delayed fluorescence (TADF).

The full width at half maximum (FWHM) of the fluorescent dopant can be 40 nm or less.

The fluorescent dopant can have a singlet energy level having a difference of 0.4 eV or less with the second triplet energy level.

A spectral overlap between a photoluminescence spectrum of the phosphorescent dopant and an absorption spectrum of the fluorescent dopant can be 20 nm or less.

The triplet energy level of the at least one host can be higher than or equal to the first triplet energy level.

The organic light emitting device can further include at least one of an electron blocking layer provided between the light emitting layer and the first electrode and a hole blocking layer provided between the light emitting layer and the second electrode, and the triplet energy levels of the electron blocking layer and the hole blocking layer can be higher than or equal to the triplet energy level of the at least one host of the light emitting layer.

The fluorescent dopant can generate fluorescence of the fluorescent dopant itself in addition to the thermally activated delayed fluorescence (TADF), when energy is released from a singlet excited state to a ground state of the fluorescent dopant.

Energy can be transferred from the at least one host and the phosphorescent dopant to a singlet excited state and a triplet excited state of the fluorescent dopant; and the energy transferred to the triplet excited state of the fluorescent dopant can be transferred to the singlet excited state of the fluorescent dopant through reverse intersystem crossing (RISC) and be used to generate the thermally activated delayed fluorescence (TADF).

The first triplet energy level of the phosphorescent dopant can be lower than or equal to an energy level in a singlet excited state of the fluorescent dopant.

The organic light emitting device can further include at least one common layer provided between the first electrode and the light emitting layer and at least one common layer provided between the second electrode and the light emitting layer, and the at least one common layer contacting the light emitting layer can include a material having a triplet energy level higher than or equal to a triplet energy level of the at least one host.

The light emitting layer can include not less than 50 wt % of the at least one host, and 0.1 w % to 30 wt % of each of the fluorescent dopant and the phosphorescent dopant.

The host can include a plurality of hosts having different carrier transport characteristics.

A difference between an emission peak wavelength of the fluorescent dopant and an emission peak wavelength of the phosphorescent dopant can fall within a range of 30 nm.

Further, a display device according to the present invention in order to achieve the same objects can include a substrate comprising a plurality of subpixels, a thin film transistor provided in each of the subpixels, and an organic light emitting device provided in each of the subpixels so as to be connected to the thin film transistor, the organic light emitting device can include a first electrode and a second electrode arranged opposite each other, and a plurality of stacks provided between the first and second electrodes so as to be distinguished from each other by charge generation layers, and a light emitting layer of at least one of the stacks can include at least one host, a phosphorescent dopant configured to have a first triplet energy level, and a fluorescent dopant configured to have a second triplet energy level lower than the first triplet energy level and to generate thermally activated delayed fluorescence (TADF).

The full width at half maximum (FWHM) of the fluorescent dopant can be 40 nm or less, and the fluorescent dopant can have a singlet energy level having a difference of 0.4 eV or less with the second triplet energy level.

A spectral overlap between a photoluminescence spectrum of the phosphorescent dopant and an absorption spectrum of the fluorescent dopant can be 20 nm or less.

At least two stacks of the plurality of stacks can include light emitting layers, respectively, and each of the light emitting layer can have the at least one host, the phosphorescent dopant and the fluorescent dopant, in overlapping regions between the respective subpixels.

A first subpixel can have a first color light emitting layer including a first host, a first phosphorescent dopant and a first fluorescent dopant, and a second pixel can have a second color light emitting layer including a second host, a second phosphorescent dopant and a second fluorescent dopant each other.

The stacks can include a first blue light emitting stack comprising at least one blue light emitting layer comprising the host, the phosphorescent dopant and the fluorescent dopant, and a long-wavelength light emitting stack arranged opposite to the first blue light emitting stack with the charge generation layer interposed therebetween to emit light of wavelengths longer than blue wavelengths.

The display device can further include a plurality of color filter layers provided under the first electrode or on the second electrode to emit light of different colors in the respective subpixels.

The stacks can further include a second blue light emitting stack including a host and a single dopant.

The stacks can include a plurality of first blue light emitting stacks.

The above-described organic light emitting device and display device according to the present invention use different kinds of dopants, i.e., the phosphorescent dopant and the fluorescent dopant, cause energy transfer to be concentrated upon the fluorescent dopant, and cause almost all of light emission to be generated due to excitation in the singlet energy level of the fluorescent dopant through fluorescence of the fluorescent dopant itself and delayed fluorescence, thereby being capable of improving luminous efficacy of a single color. Therefore, even when different kinds of dopants are used, emission of light of a single color can be realized and color purity of the organic light emitting device can be improved. Energy can be concentrated upon the singlet energy level of the fluorescent dopant from the triplet energy level of the fluorescent dopant through reverse intersystem crossing (RISC).

Further, in the organic light emitting device and the display device according to the present invention, the fluorescent dopant receives energy from the phosphorescent dopant and the host through the mechanisms of Dexter energy transfer (DET) and Förster energy transfer (FET), and fluorescence of the fluorescent dopant itself, caused by transition of excitons from the singlet energy level to the ground state, and thermally activated delayed fluorescence (TADF), caused through reverse intersystem crossing (RISC) due to a slight energy level difference $\Delta Est$ between the triplet excited state and the singlet excited state, occur in the fluorescent dopant, thereby being capable of improving internal quantum efficiency of the excitons.

In addition, in the organic light emitting device and the display device according to the present invention, when the phosphorescent dopant is used as a dopant configured to transmit energy and the fluorescent dopant is used as a dopant configured to receive energy, energy transfer between the different kinds of dopants is realized through Dexter energy transfer (DET) and thus the triplet energy level of the phosphorescent dopant does not need to be higher than the singlet energy level of the fluorescent dopant, and thereby, energy can be transferred from the phosphorescent dopant having a lower triplet energy level to the fluorescent dopant in which thermally activated delayed fluorescence (TADF) can occur. Therefore, the phosphorescent dopant is not limited to a high triplet energy level, and thus a phosphorescent dopant structure having stability in the material therefor can be ensured.

In the organic light emitting device and the display device according to the present invention, since, among the different kinds of dopant, the fluorescent dopant, which exhibits thermally activated delayed fluorescence (TADF), and the phosphorescent dopant, which has a triplet energy level higher than the triplet energy level of the fluorescent dopant, are used in the light emitting layer, it is easy to transfer energy to the fluorescent dopant and the luminescence property of the fluorescent dopant is ensured thereby, and thus, the organic light emitting device can be used in light emitting layers and organic light emitting stacks having various structures and ensure a long lifespan thereof.

As is apparent from the above description, an organic light emitting device and a display device using the same according to the present invention have the following effects.

First, different kinds of dopants, i.e., a phosphorescent dopant and a fluorescent dopant, are used, energy transfer is concentrated upon the fluorescent dopant, and almost all of light emission is generated due to excitation in the singlet energy level of the fluorescent dopant through fluorescence of the fluorescent dopant itself and delayed fluorescence, thereby being capable of improving luminous efficacy of a single color. Therefore, even when different kinds of dopants are used, emission of light of a single color can be realized and color purity of the organic light emitting device can be improved. Energy can be concentrated upon the singlet energy level of the fluorescent dopant from the triplet energy level of the fluorescent dopant through reverse intersystem crossing (RISC).

Second, the fluorescent dopant receives energy from the phosphorescent dopant and the host through the mechanisms of Dexter energy transfer (DET) and Förster energy transfer (FET), and fluorescence of the fluorescent dopant itself, caused by transition of excitons from the singlet energy level to the ground state, and thermally activated delayed fluorescence (TADF), caused through reverse intersystem crossing (RISC) due to a slight energy level difference ΔEst between the triplet excited state and the singlet excited state, occur in the fluorescent dopant, thereby being capable of improving internal quantum efficiency of the excitons.

Third, when the phosphorescent dopant is used as a dopant configured to transmit energy and the fluorescent dopant is used as a dopant configured to receive energy, energy transfer between the different kinds of dopants is realized through Dexter energy transfer (DET) and thus the triplet energy level of the phosphorescent dopant does not need to be higher than the singlet energy level of the fluorescent dopant, and thereby, energy can be transferred from the phosphorescent dopant having a lower triplet energy level to the fluorescent dopant in which thermally activated delayed fluorescence (TADF) can occur. Therefore, the phosphorescent dopant is not limited to a high triplet energy level, and thus a phosphorescent dopant structure having stability in the material therefor can be ensured.

Fourth, since, among the different kinds of dopant, the fluorescent dopant, which exhibits thermally activated delayed fluorescence (TADF), and the phosphorescent dopant, which has a triplet energy level higher than the triplet energy level of the fluorescent dopant, are used in the light emitting layer, it is easy to transfer energy to the fluorescent dopant and the luminescence property of the fluorescent dopant is ensured thereby, and thus, the organic light emitting device can be used in light emitting layers and organic light emitting stacks having various structures and ensure a long lifespan thereof.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting device comprising:

a light emitting layer provided between a first electrode and a second electrode arranged opposite each other, wherein the light emitting layer comprises at least one host, a blue phosphorescent dopant for a blue color and a blue fluorescent dopant for the blue color in a single layer, wherein a light emission for the blue color is concentrated upon the blue fluorescent dopant through energy transfers from the host and the blue phosphorescent dopant to the blue fluorescent dopant in the single layer, wherein the blue phosphorescent dopant is configured to have a first triplet energy level; and wherein the blue fluorescent dopant is configured to have a second triplet energy level lower than the first triplet energy level and to generate fluorescence and thermally activated delayed fluorescence (TADF).

2. The organic light emitting device according to claim 1, wherein a full width at half maximum (FWHM) of the blue fluorescent dopant is approximately 40 nm or less.

3. The organic light emitting device according to claim 1, wherein the blue fluorescent dopant has a singlet energy level having a difference of approximately 0.4 eV or less than the second triplet energy level.

4. The organic light emitting device according to claim 2, wherein an emission peak of the blue phosphorescent dopant is spaced from an emission peak of the blue fluorescent dopant within 40 nm and a spectral overlap between a photoluminescence spectrum of the blue phosphorescent dopant and an absorption spectrum of the blue fluorescent dopant is approximately 20 nm or less.

5. The organic light emitting device according to claim 1, wherein a triplet energy level of the at least one host is higher than or equal to the first triplet energy level.

6. The organic light emitting device according to claim 1, wherein the blue fluorescent dopant generates fluorescence of the blue fluorescent dopant itself in addition to the thermally activated delayed fluorescence (TADF), when energy is released from a singlet excited state to a ground state of the blue fluorescent dopant.

7. The organic light emitting device according to claim 3, wherein:

energy is transferred from the at least one host and the blue phosphorescent dopant to the singlet excited state of the blue fluorescent dopant and a triplet excited state of the blue fluorescent dopant; and the energy transferred to the triplet excited state of the blue fluorescent dopant is transferred to the singlet excited state of the blue fluorescent dopant through reverse intersystem crossing (RISC), and is used to generate the thermally activated delayed fluorescence (TADF).

8. The organic light emitting device according to claim 1, wherein the first triplet energy level of the blue phosphorescent dopant is lower than or equal to an energy level in a singlet excited state of the blue fluorescent dopant.

9. The organic light emitting device according to claim 5, further comprising at least one common layer provided between the first electrode and the light emitting layer and at least one common layer provided between the second electrode and the light emitting layer, wherein the at least one common layer contacting the light emitting layer comprises a material having a triplet energy level higher than or equal to a triplet energy level of the at least one host.

10. The organic light emitting device according to claim 1, wherein the light emitting layer comprises:

not less than approximately 50 wt % of the at least one host; and approximately 0.1 w % to 30 wt % of each of the blue fluorescent dopant and the blue phosphorescent dopant.

11. The organic light emitting device according to claim 1, wherein the at least one host comprises a plurality of hosts having different carrier transport characteristics.

12. The organic light emitting device according to claim 1, wherein a difference between an emission peak wavelength of the blue fluorescent dopant and an emission peak wavelength of the blue phosphorescent dopant falls within a range of approximately 30 nm.

13. The organic light emitting device according to claim 1, further comprising another light emitting layer for a color other than the blue color.

14. A display device comprising:

a substrate comprising a plurality of subpixels;

a thin film transistor provided in each of the plurality of subpixels; and an organic light emitting device provided in each of the plurality of subpixels so as to be connected to the thin film transistor, wherein the organic light emitting device comprises a first electrode and a second electrode arranged opposite each other, and a plurality of stacks provided between the first and second electrodes so as to be distinguished from each other by charge generation layers, wherein the plurality of stacks comprise:

a first blue light emitting stack comprising at least one blue light emitting layer having at least one host, a blue phosphorescent dopant for a blue wavelength and a blue fluorescent dopant for the blue wavelength in a single layer; and a long-wavelength light emitting stack arranged opposite to the first blue light emitting stack with the charge generation layers interposed therebetween so as to emit light of wavelengths longer than blue wavelengths, wherein a light emission is concentrated upon the blue fluorescent dopant through energy transfers from the host and the blue phosphorescent dopant to the blue fluorescent dopant in the single layer, wherein the blue phosphorescent dopant is configured to have a first triplet energy level; and wherein the blue fluorescent dopant is configured to have a second triplet energy level lower than the first triplet energy level and to generate fluorescence and thermally activated delayed fluorescence (TADF).

15. The display device according to claim 14, wherein:

a full width at half maximum (FWHM) of the blue fluorescent dopant is approximately 40 nm or less; and the blue fluorescent dopant has a singlet energy level having a difference of approximately 0.4 eV or less with the second triplet energy level.

16. The display device according to claim 14, wherein a spectral overlap between a photoluminescence spectrum of the blue phosphorescent dopant and an absorption spectrum of the blue fluorescent dopant is approximately 20 nm or less.

17. The display device according to claim 14, wherein the long-wavelength light emitting stack comprises a second host, a second phosphorescent dopant and a second fluorescent dopant for a color emitted by the long-wavelength light emitting stack.

18. The display device according to claim 14, further comprising a color filter layer provided under the first electrode or on the second electrode so as to emit light of different colors in the respective subpixels.

19. The display device according to claim 14, wherein the plurality of stacks further comprise a second blue light emitting stack having a host and a single dopant.

20. The display device according to claim 14, wherein the plurality of stacks comprise a plurality of first blue light emitting stacks.

21. A display device comprising:

a substrate comprising a plurality of subpixels;

a thin film transistor provided in each of the plurality of subpixels; and an organic light emitting device provided in each of the plurality of subpixels so as to be connected to the thin film transistor, wherein the organic light emitting device comprises a first electrode and a second electrode arranged opposite each other, and a plurality of stacks provided between the first and second electrodes so as to be distinguished from each other by charge generation layers, wherein the plurality of stacks comprise a plurality of light emitting layers, each of the plurality of light emitting layers having at least one host, a phosphorescent dopant and a fluorescent dopant for the same color emission at at least one of the plurality of subpixels and the plurality of light emitting layers are overlapped at the at least one of the plurality of subpixels, wherein a light emission is concentrated upon the fluorescent dopant through energy transfers from the host and the phosphorescent dopant to the fluorescent dopant in the single layer, wherein the phosphorescent dopant is configured to have a first triplet energy level; and wherein the fluorescent dopant is configured to have a second triplet energy level lower than the first triplet energy level and to generate fluorescence and thermally activated delayed fluorescence (TADF).

22. The display device according to claim 21, wherein:

a first subpixel has a first color light emitting layer comprising a first host, a first phosphorescent dopant and a first fluorescent dopant;

a second pixel has a second color light emitting layer comprising a second host, a second phosphorescent dopant and a second fluorescent dopant; and at least the first fluorescent dopant and the second fluorescent dopant are different from each other.

* * * * *